US011328230B2

(12) United States Patent
Gold et al.

(10) Patent No.: US 11,328,230 B2
(45) Date of Patent: *May 10, 2022

(54) MULTINODAL POWER SENSING, AGGREGATION, AND TRANSMISSION

(71) Applicant: Quabbin Patent Holdings, Inc., Barre, MA (US)

(72) Inventors: Steven K. Gold, Amherst, MA (US); Robert Plotkin, Barre, MA (US)

(73) Assignee: Quabbin Patent Holdings, Inc., Amherst, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/883,722

(22) Filed: May 26, 2020

(65) Prior Publication Data

US 2020/0286010 A1  Sep. 10, 2020

Related U.S. Application Data

(63) Continuation of application No. 15/445,527, filed on Feb. 28, 2017, now Pat. No. 10,671,946.

(60) Provisional application No. 62/356,353, filed on Jun. 29, 2016, provisional application No. 62/300,859, filed on Feb. 28, 2016.

(51) Int. Cl.
| H04L 29/08 | (2006.01) |
| G06Q 10/06 | (2012.01) |
| G01R 21/133 | (2006.01) |
| H04L 67/12 | (2022.01) |

(52) U.S. Cl.
CPC .......... *G06Q 10/06* (2013.01); *G01R 21/133* (2013.01); *H04L 67/12* (2013.01)

(58) Field of Classification Search
None
See application file for complete search history.

(56) References Cited

U.S. PATENT DOCUMENTS

| 10,209,281 B2* | 2/2019 | Dibb ..................... G01R 21/133 |
| 10,482,421 B1* | 11/2019 | Ducrou .............. G06K 9/00671 |
| 10,671,946 B2* | 6/2020 | Gold .................... G01R 21/133 |
| 2013/0173081 A1* | 7/2013 | Sakamoto ................. G06F 1/26 700/297 |
| 2015/0123815 A1* | 5/2015 | Mejegard ............... G06Q 10/06 340/870.07 |
| 2015/0212124 A1* | 7/2015 | Kashiwagi ........... G01R 19/165 324/103 R |
| 2017/0192042 A1* | 7/2017 | Micali .................... G05B 15/02 |

* cited by examiner

*Primary Examiner* — Anh Vu H Ly
(74) *Attorney, Agent, or Firm* — Blueshift IP, LLC; Robert Plotkin

(57) ABSTRACT

A power source provides power (e.g., electrical power) to a powered object. The object is identified and the amount of power consumed by the object is measured. Information representing the object identity and the amount of power consumed by the object is transmitted to a remote server. Proximity between a device and the object may be determined, in response to which the device may obtain the information representing the object identity and the amount of power consumed by the object, and transmit such information to the remote server, in addition to information representing an identity of a user of the device.

18 Claims, 6 Drawing Sheets

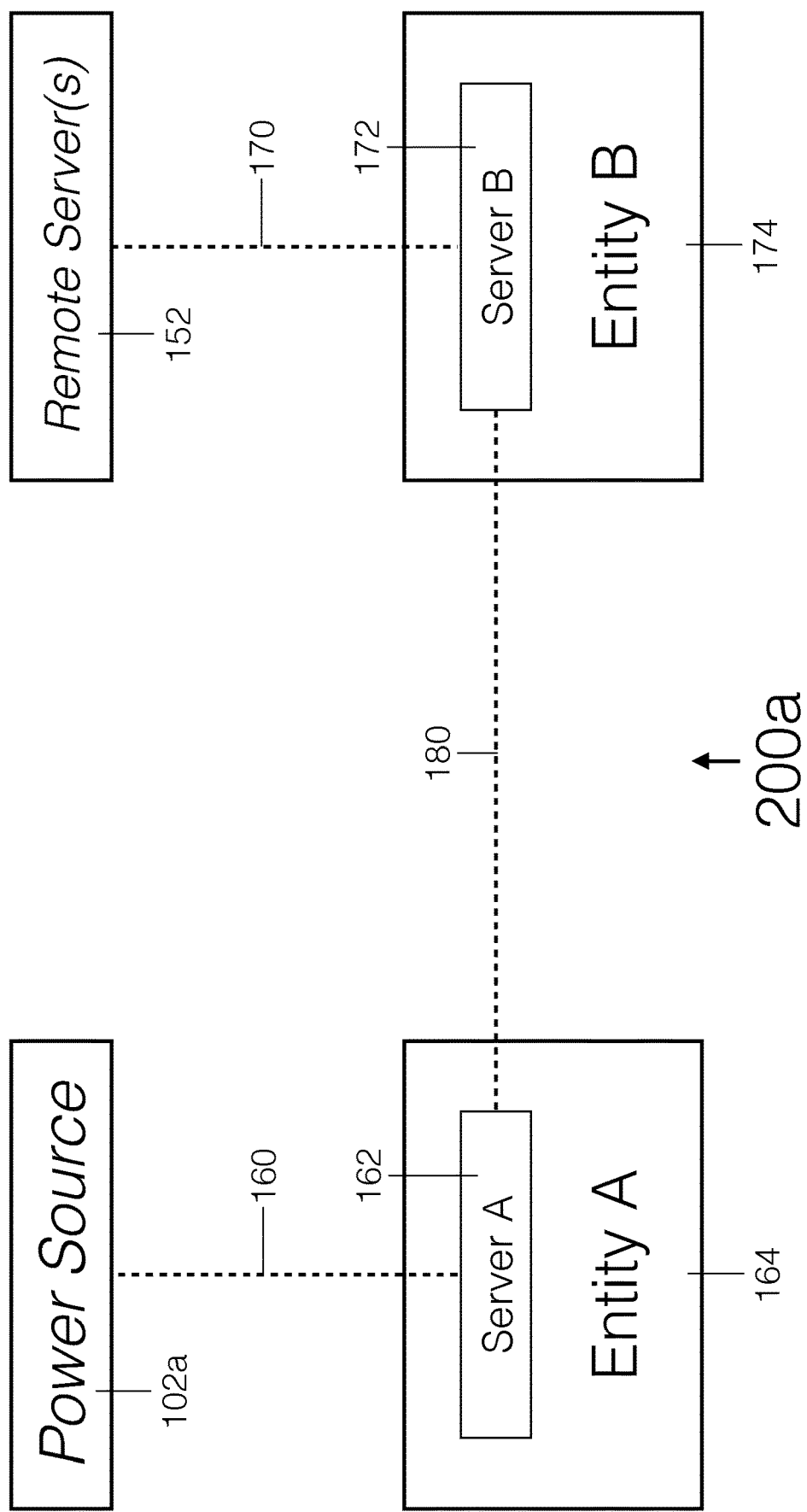

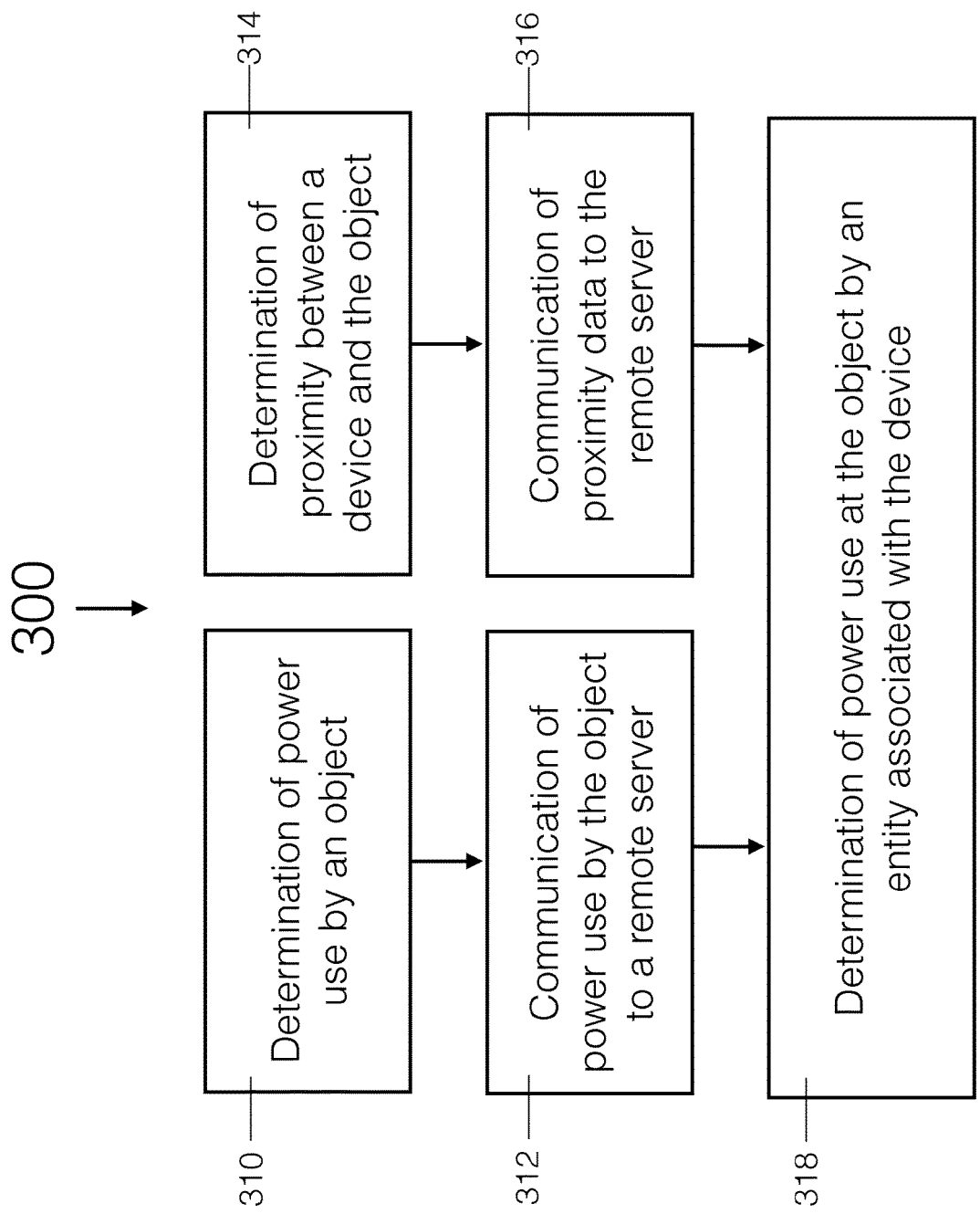

MULTINODAL POWER SENSING, AGGREGATION, AND TRANSMISSION

BACKGROUND

Technologies have recently been developed to identify the signatures of individual electrical devices, providing knowledge about what devices are being used, when they are being used, how much power they are utilizing, and more. It is desirable to improve upon such technology to further determine information about users of devices to empower new and useful information, such as knowledge about which user is using a particular device during a specific time period. This knowledge may be used to provide a user profile, help users to be more energy-conscious and efficient, and to enable a multitude of energy payment mechanisms that are only be possible by associating specific device and energy use with a specific user.

SUMMARY

A power source provides power (e.g., electrical power) to a powered object. The object is identified and the amount of power consumed by the object is measured. Information representing the object identity and the amount of power consumed by the object is transmitted to a remote server. Proximity between a device and the object may be determined, in response to which the device may obtain the information representing the object identity and the amount of power consumed by the object, and transmit such information to the remote server, in addition to information representing an identity of a user of the device.

BRIEF DESCRIPTION OF THE DRAWINGS

FIG. 2 is a dataflow diagram of a system for communicating power usage and other data among a remote server, two entities, and a power source according to one embodiment of the present invention.

FIGS. 3a-3b are flowcharts of methods for determining power use at an object by an entity according to embodiments of the present invention.

DETAILED DESCRIPTION

Figure 1A:
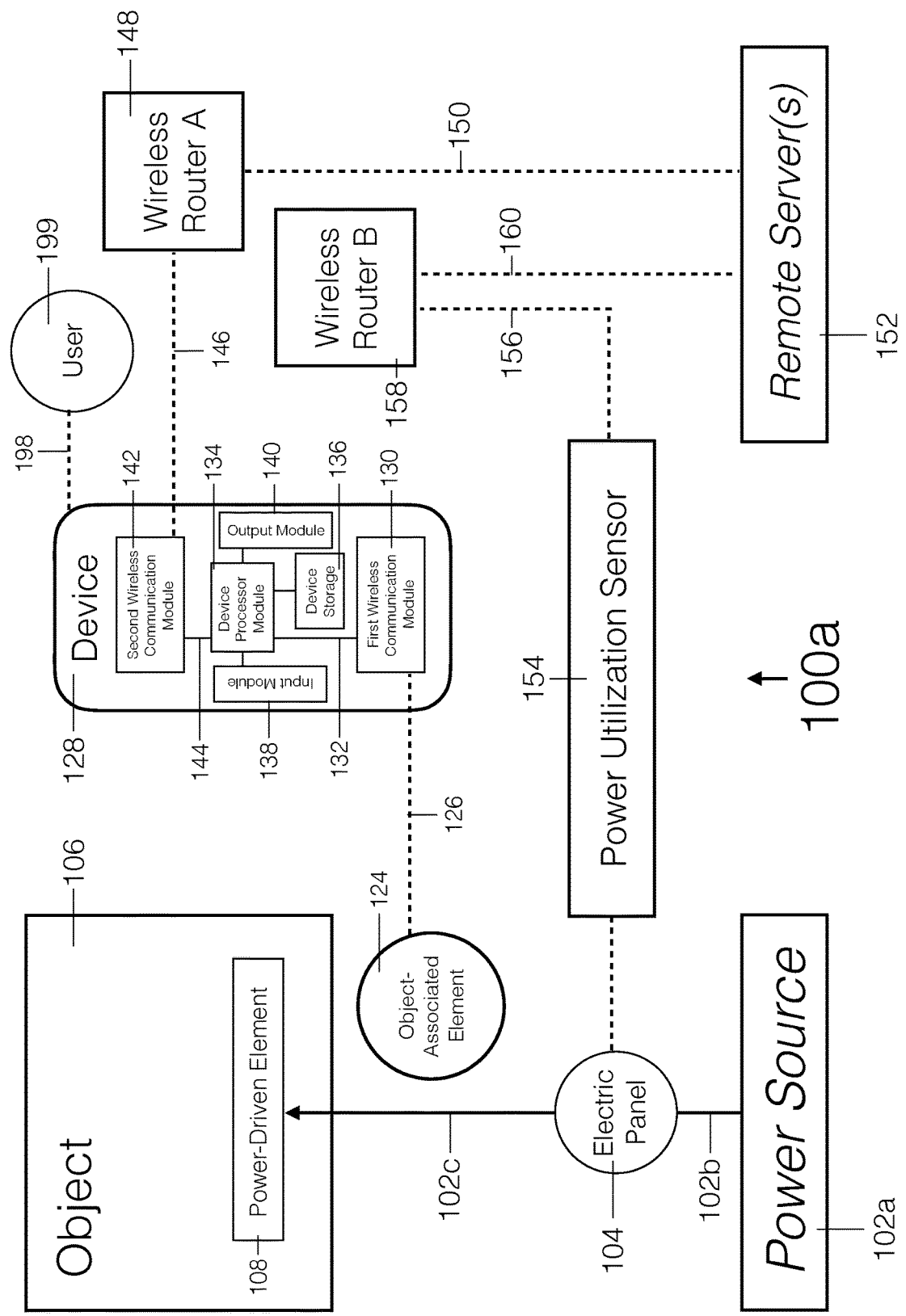
FIGS. 1a-1c are diagrams of systems for sensing electrical power used by one or more objects according to embodiments of the present invention.

Referring to FIG. 1a, a system 100a according to one embodiment of the present invention is shown for sensing electrical power used by one or more objects, for deriving metrics from such sensed power, and for transmitting signals representing such metrics over one or more communication networks. In the system 100a of FIG. 1a, a power source 102a delivers power to a power-driven element 108 of an object 106. A device 128 may be associated with a user 199 of the device 128. An object-associated element 124, e.g., RFID tag, enables the system 100a to determine whether the device 128 (and its user 199) is in proximity to the object 106. The system 100a may, in response to determining that the device 128 (and the user 199) are in proximity to the object 106, calculate, estimate, or otherwise determine an amount of energy used by the object 106 on behalf of the user 199. Such a determination may, for example, be based at least in part on data from a power utilization sensor 154 indicating an amount of energy used by the object 106 during a particular time period. This information may further be used to debit or credit a financial account of the user 199 and/or another person/entity.

As stated above, the device 128 may be associated with the user 199. This association is represented by object-associated element 124 in FIG. 1a. The association data 198 may represent the association between the device 128 and the user 199 in any of a variety of ways, such as by containing data representing the device 128, data representing the user 199, and data representing an association between the device 128 and the user 199. As another example, the association data 198 may be a record (e.g., a database record) which contains data representing the device 128 and data representing the user 199, in which case the storage of such data in a single record indicates that the device 128 is associated with the user 199. The association data 198 may or may not include data representing the device 128, since the storage of the association data 198 within the device 128 may implicitly indicate that the association data 198 is associated with the device 128.

Different users may use the device 128 at different times. The association data 198 may change over time to reflect this, such as by containing data identifying a first user (e.g., user 199) during a time when the first user is using the device 128 and then containing data identifying a second user (not shown) during a time when the second user is using the device 128. The system 100a may detect which user is using the device 128 at a particular time and, in response to this detection, modify the association data 198 to include data representing the detected user. The system 100a may detect which user is using the device 128 at a particular time in any of a variety of ways, such as by identifying the user who is currently logged in to the device 128 at a particular time as the user who currently is using the device 128 at that time.

The user 199 may "use" the device 128 in any of a variety of ways, such as by directly interacting with the device 128, e.g., providing input to the device, such as by pressing buttons on the device 128 or speaking into the device 128. The system 100a may consider the user 199 to be using 199 or otherwise associated with the device 128 while the user 199 is interacting with the device 128, e.g., in response to detecting that the user 199 is providing input to or otherwise interacting with the device 128. The system 100a may, however, consider the user 199 to be using or otherwise associated with the device 128 even while the user 199 is not providing input to or otherwise interacting with the device 128. For example, the system 100a may determine that the user 199 is an owner, lessee, or operator of the device 128 and, in response to this determination, the system 100a may conclude that the user 199 is using or otherwise associated with the device 128 indefinitely, or until some criterion is satisfied, such as until the system 100a determines that the user 199 is no longer the owner, lessee, or operator of the device 128. As another example, the system 100a may determine that the user 199 is logged into an account on or via the device 128 (such as an operating system user account, an account associated with the power source 102a (such as a power utility company account), or an account associated with the power utilization sensor 154) and, in response to this determination, the system 100a may conclude that the user 199 is using or otherwise associated with the device 128 indefinitely, or until some criterion is satisfied, such as until the system 100a determines that the user 199 is no longer logged into the account, or until the system 100a determines that another user has logged into the account.

As yet another example, the system 100*a* may determine that the user 199 has turned on or otherwise interacted with the object 106 and, in response to this determination, the system 100*a* may conclude that the user 199 is using or otherwise associated with the device 128 indefinitely, or until some criterion is satisfied, such as until the system 100*a* determines that the user 199 has turned off or otherwise stopped interacting with the object 106, or until the system 100*a* determines that the object 106 has been turned off or is no longer consuming power or connected to the power source 102*a*. As yet another example, the system 100*a* may determine that the user 199 has turned on or otherwise interacted with the device 128 and, in response to this determination, the system 100*a* may conclude that the user 199 is using or otherwise associated with the device 128 indefinitely, or until some criterion is satisfied, such as until the system 100*a* determines that the user 199 has turned off or otherwise stopped interacting with the device.

The user 199 may, for example, be a person, a group of people (e.g., an enumerated set of people or a group of people defined by a group identifier (e.g., family name or account number), e.g., a department or organization name or identifier), or an organization (e.g., non-profit or for-profit company).

The power source 102*a* provides power 102*b* to the object 106, which may, for example, be one of many powered objects in a home, office, or commercial setting. The power 102*b* may, for example, be electrical power. Although the description herein may refer specifically to electrical power in certain instances, even such embodiments of the present invention may, alternatively or additionally, be applied to types of power other than electrical power (such as kinetic energy, e.g., kinetic energy released as the result of combustion). The power source 102*a* may, for example, be any one or more of the following, in any combination: a public electric utility service, a micro-grid, an on-site (or nearby) electrical generator or collection of generators, an electric panel, and an electrical outlet. The power source 102*a* may provide the power 102*b* to one or a plurality of connection points (such as electrical outlets). The object 106 may connect to such a connection point, such as through the use of a plug, attached to the object 106, which is plugged into one of the electrical outlets.

In the particular example of FIG. 1*a*, the power source 102*a* provides (outputs) power 102*b*, which is received by an electric panel 104. As described in more detail below, the object 106 may be connected to a particular circuit in the electric panel 104, which may provide (output) electrical power 102*c* to the object 106. The electrical power 102*c* may be a subset of the electrical power 102*b*. The electric panel 104 may be any controller, with one or more circuits, for delivering power, and need not be, for example, a residential electric panel.

The electric panel 104, however, is optional and is not a requirement of the present invention. Alternatively, for example, the electric panel 104 may be omitted, and the power source 102*a* may provide power 102*b* to the object 106 without the use of the electric panel 104. Any reference herein to the power source 102*a* providing power to the object 106 and to the object 106 receiving power from the power source 102*a* should be understood to include embodiments including the electric panel 104 and embodiments not including the electric panel 104. As a result, references to power 102*b* should be understood to refer to power that is provided to the object 106 in embodiments not including the electric panel 104, and references to power 102*c* should be understood to refer to power that is received from the power source 102*a* in embodiments not including the electric panel 104. As this implies, the power 102*b* and the power 102*c* may be the same power.

The power source 102*a* may be any source of power 102*b* for the object 106. For example, the power source 102*a* may be a relatively direct source of power 102*b* for the object 106, such as an electrical outlet, in which case the object 106 may, for example, receive power 102*b* from the power source 102*a* via a power cord of the object 106 which has a plug which is coupled to (e.g., plugged into) the electrical outlet. As this example illustrates, although the object 106 may only receive power 102*b* from one power source (e.g., electrical outlet) at any particular point in time, the object 106 may switch to receiving power 102*b* from a different power source at a different point in time, such as by removing the plug of the object 106 from one electrical outlet and plugging it into a different electrical outlet. "Different power sources" may be different sub-source of the same power source, such as different outlets connected to the same circuit, different circuits connected to the same electric panel, or different electric panels connected to the same power plant.

As another example, the power source 102*a* may be a relatively indirect source of power 102*b* for the object 106, such as a power transmission line (which, for example, provides power to multiple outlets within a building, and possibly to multiple buildings) or a power plant (also referred to as a power station, generating station, powerhouse, or generating plant). As yet another example, the power source 102*a* may be one of a plurality of physical power plants that provide power 102*b* to the object 106, which may be owned and/or operated by an entity, such as an electrical utility company. As yet another example, the power source 102*a* may be a local and/or self-contained power source, such as a solar panel connected to the object 106, possibly directly (e.g., without the intermedia electric panel 104), and possibly connected to the object 106 and to no other objects. The power source 102*a* may, for example, be contained, in whole or in part, within the object 106.

The electric panel 104 may, for example, be any existing or future kind of distribution board, panelboard, or breaker panel. The electric panel 104 may include a plurality of subsidiary circuits. The electric panel 104 may receive the power 102*b* (or a subset thereof) from the power source 102*a* and divide the received power 102*b* into the plurality of subsidiary circuits. Each such subsidiary circuit may provide power to one or more objects, such as by providing power to one or more corresponding electrical outlets. For example, the object 106 may be connected (e.g., using a plug) at a particular time to a particular electrical outlet that is connected to a particular circuit within the electric panel, and thereby receive electric power from that particular circuit. A particular circuit of the electric panel 104 may provide power to zero, one, or a plurality of objects at any particular time.

Different circuits of the electric panel 104 may provide power to different objects at any particular time. For example, FIG. 1*a* shows the power 102*c* that the electric panel 104 provides to the object 106 at a particular time or over time. The power 102*c* may be a subset of the power 102*b* provided by the power source 102*a* to the electric panel 104, such as power provided by one of the circuits of the electric panel 104. Not shown in FIG. 1*a* is power which may be provided by the same circuit of the electric panel 104 to one or more other objects, and power which may be provided by other circuits of the electric panel 104 to other objects. As described elsewhere herein, the electric panel 104 is optional. In the absence of the electric panel, the power source 102a may provide power 102b directly to the object 106.

The power source 102a may deliver the power 102b via any suitable means, which may include wired and/or wireless means, in any combination. Examples of such means include cables, wires, cords, outlets, and wireless power transmission means (e.g. means for transmitting power wirelessly using time-varying electric, magnetic, and/or electromagnetic fields, including both non-radiative and radiative wireless power transmission means). The power source 102a may be a source of non-electric power. The power source 102a may, for example, deliver (possibly in addition to electric power) mechanical, chemical, nuclear, and/or biological power.

The power source 102a may deliver the power 102b over time. Properties of the power 102b (e.g., amplitude, frequency) may fluctuate over time. Therefore, properties of the power 102b received by the electric panel 104 may vary over time. Similarly, the electric panel 104 may deliver the power 102c over time. Properties of the power 102c (e.g., amplitude, frequency) may fluctuate over time. Therefore, properties of the power 102c received by the object 106 may vary over time.

The power 102b and the power 102c may vary over time for a variety of reasons. For example, the power 102c may vary over time in response to the demand placed by the object 106 on the electric panel 104 for power. At a particular time, the object 106 may demand a certain type and/or amount of power from the electric panel 104 (and/or power source 102a). In response to such a demand, the electric panel 104 (and/or power source 102a) may modify the amount and/or other properties of the power 102c provided by the electric panel 104 to the object 106, such as by providing or attempting to provide, to the object 106, power of the type and/or amount demanded by the object 106. As the demand placed by the object 106 on the electric panel 104 (and/or the power source 102a) for electric power varies over time, the electric panel 104 (and/or power source 102b) may vary its response over time accordingly. The same is true in connection with other objects (not shown) that place power demands on the electric panel 104 and/or power source 102a. As will be described in more detail below, the delivery of power to the object 106 over time may be conceptualized as the delivery of a plurality of discrete units of power to the object 106 over time, even if in practice the power actually delivered to the object 106 is not so divided.

The object 106 may be connected to, and receive power 102c from, one electric panel 104 during one period of time, and then be connected to, and receive power from, a different electric panel (not shown) during a different period of time. Similarly, the object 106 may be connected to, and receive power from, one circuit of the electric panel 104 during one period in time, and then be connected to, and receive power from, a different circuit of the same electric panel 104 during a different period of time. Similarly, the object 106 may be connected to (directly or indirectly), and received power from one power source 102a during one period of time, and then be connected to, and receive power from, a different power source (not shown) during a different period of time. The power 102c received by the object 106 may, therefore, include power received by the object 106 from one or more circuits, electric panels, and power sources.

The object 106 may be any physical object that is capable of receiving power 102b from the power source 102a and/or power 102c from the electric panel 104, and that is capable of consuming such power to perform work. The object 106 may, for example, be or include any one or more of the following, or any component thereof, in any combination:

an appliance (e.g., a television, radio, lamp, fan, air conditioner, heater, hair dryer, coffee maker, refrigerator, stove, oven dishwasher, blender, toaster, clothes washer, or clothes dryer);

a computer (e.g., a desktop computer, laptop computer, tablet computer, smartphone, wearable computer, or videogame console);

a computer peripheral (e.g., printer, monitor, mouse, trackpad, keyboard, disk drive or other storage device);

a vehicle (e.g., automobile, a boat, or an aircraft);

a building, or a portion thereof, such as a room, area, floor, or a portion that is separately owned or leased (e.g., apartment or office);

a collection of buildings, such as a discrete set of buildings, campus, neighborhood, town, or city;

an object that does not include any electrical components or which otherwise includes one or more components which are driven by non-electric power (whether or not the object also includes one or more components which are driven by electric power), such as a mechanical object with moving parts whose motion is driving by mechanical power; or any collection of objects for which power may be monitored as a unit.

More generally, the term "object" (e.g., the object 106) may refer to any single physical object or collection of objects for which the system 100a may monitor power usage.

The object 106 may receive the power 102c using, for example: (1) a wired interconnect mechanism (such as a power cord) that couples the object 106 (and the power-driven element 108 within the object) to the power source 102a by one or more wires; or (2) a wireless (e.g., inductive) power source, such as a wireless charging dock. The object 106 may receive power 102c from a single power source (such as power source 102a) or multiple power sources (such as power source 102a and one or more other power sources, not shown) at any particular point in time, or during any particular period of time, such power of any of the kind(s) disclosed herein, provided by any power source(s) of the kind(s) disclosed herein.

The object 106 may include various components, which may be enclosed within an external physical housing. Such a housing may, for example, have one or more holes, gaps, or other openings (such as vents, cavities, or exhausts), but otherwise enclose some or all of the components of the object 106. The object 106 need not, however, be enclosed within a single housing. Various components of the object 106 may, for example, be contained within a plurality of housings. Components within the object 106 may be connected to other components within the object 106 by any combination of mechanical, electrical, and chemical connections, which may include, for example, wired and/or wireless connections.

The object 106 includes at least one power-driven element 108, which receives at least some of the power 102b and/or 102c and which consumes at least some of the power 102b and/or 102c to perform work. The power-driven element 108 may, for example, be or include any one or more of the following in any combination: a motor, an engine, a light, a processor, a controller, a heating element, a cooling element, a display, an actuator, a sensor, a driver, a transmitter, a receiver, or a speaker.

Although the object 106 is shown in FIG. 1 as including only one power-driven element 108, this is merely an example and not a limitation of the present invention. The object 106 may include any number of power-driven elements (e.g., 1, 2, 3, or more power-driven elements), so long as the object 106 includes at least one power-driven element. If the object 106 includes more than one power-driven element, each such power-driven element may receive any portion of the power 102b and/or 102c, and may consume any portion of its received power to perform work. Any reference herein to the power-driven element 108 should be understood to refer to any one or more power-driven elements in the object 106.

The object-associated element 124 is associated with the object 106. The object-associated element 124 may be associated with the object 106 in any of a variety of ways. For example, the object-associated element 124 may be attached to, embedded within, be integrated with, be in the vicinity of, contain a reference to (e.g., a logo or other brand identifier of), or be in communication with, the object 106, or any combination thereof.

The system 100a may determine that the device 128 is in proximity with the object-associated element 124, for example. The system 100a may make this determination in any of a variety of ways, such as by using any of a variety of technologies, e.g., radiofrequency identification (RFID), near-field communication (NFC), beacon signals (e.g., Apple Inc.'s iBeacon product), Bluetooth (standard or low energy) means, optical identification (e.g., image recognition of an object), or triangulation technology, sensing and processing of audio signals, and sensing and processing of user behavior (e.g., sensing motion of the user 199 and determining that such motion indicates that the user 199 is using or otherwise in proximity to the object 106).

The term "proximity," as used herein, may refer, for example, to physical closeness, such as between the device 128 and the object-associated element 124. Terms such as "determining whether A (e.g., device 128) and B (e.g., object-associated element 124) are in proximity to each other," "determining proximity," "detecting proximity," "determining proximity between," and "making a determination of proximity" are used interchangeably herein. Similarly, terms such as "a period of proximity between" and "a time of proximity between" are used interchangeably herein to refer to a time or times during which two elements (e.g., a device and an object) are in proximity to each other. Although certain examples herein may refer to determining proximity between a device and an object-associated element, such examples are equally applicable to determining proximity between any two or more elements of the systems 100a-c of FIG. 1a (e.g., any two or more of the power source 102a, electric panel 104, power utilization sensor, object-associated element 124, object 106, device 128, user 199, and remote server 152).

An object and a device may, for example, be considered to be in proximity to each other if and only if the object and the device are no greater than a particular distance (a "proximity threshold") from each other. Examples of such proximity thresholds are, without limitation, 10 meters, 1 meter, 50 centimeters, 1 centimeter, and 2 millimeters. For example, when a device and an object are within 1 meter of one another, embodiments of the present invention may consider the device and the object to be in proximity to each other. As another example, when a device and an object are within 1 millimeter of one another, embodiments of the present invention may consider the device and the object to be in proximity to each other. As yet another example, embodiments of the present invention may consider a device and an object that have touched or are touching (in direct contact) to be in proximity to each other. As another example, embodiments of the present invention may determine that a device is in proximity to an object by determining that a location of the device satisfies a proximity criterion in relation to a location of the object. For example, if the object is a theater, then embodiments of the present invention may determine that the device is in proximity to the theater lobby by determining that the location of the device is within the boundaries of the theater lobby, or by determining that the device is within some maximum threshold distance of the center of the theater lobby. In yet another embodiment of the present invention, a device and object may be determined to be in proximity to each other in response to determining that a signal being transmitted by the object (or an object-associated RFID, NFC or other transmitter or tag) is being received by a receiver, such as a receiver associated with the device. For example, when a device is close enough to an object transmitter and receives a signal from the transmitter, the object and the device may be determined to be in proximity based on receipt of the signal. Although a determination of proximity may be without regard for a specific distance between the object and the device, some types of transmitters (e.g., RFID, NFC) typically transmit signals that may only be received within a certain range (although the range may vary due to environmental conditions, etc.). Different proximity thresholds may be applied to different types of object, to compensate for or address the size or movement of the object, for example. For example, a proximity threshold that is applied to a small object, such as a can of soup, may be useful to be relatively small (e.g., 20 centimeters) in comparison to a proximity threshold that is applied to a ship, which may be useful to be relatively large (e.g., a mile). In embodiments of the present invention, a proximity threshold may be defined (e.g., pre-specified) as a particular physical distance, while in other embodiments of the present invention proximity thresholds may vary, for example according to the type of object or even the particular object. Proximity may be determined at the device or remotely, such as at a remote server or processor, for example. The foregoing examples of the concept of proximity and proximity thresholds are not intended to be limiting in any way, and other examples of the concept of proximity fall within the scope of the present invention.

Embodiments of the present invention may determine whether an object and a device are in proximity to each other in any of a variety of ways. For example, embodiments of the present invention may determine whether an object and a device are in proximity to each other using near-field communication (NFC) technology. As another example, embodiments of the present invention may determine whether a device and an object are in proximity to each other using radio frequency identification (RFID) technology. For example, a RFID tag (which may be active or passive) may be attached to (or otherwise associated with) an object, and the RFID tag may wirelessly communicate a signal that is received by a device, which may conclude, based on the device's receipt of the signal, that the RFID tag (and the object by association) and the device are in proximity with one another. Generally speaking, most RFID tags are only detectable (by a receiver) within a generally known distance or range. The term RFID is intended to be broadly interpreted, and includes (without limitation) any of a wide variety of locating and local signal transmission and reception technologies, including but not limited to Apple, Inc.'s iBeacon product, Bluetooth technology, Bluetooth Low Energy technology, wireless (e.g., Wi-Fi) geolocation technologies, as well as other technologies, products, transmitters and tags that may be associated with objects (e.g., things, places), along with their counterparts located at the device (e.g., a wireless receiver), to enable detection of proximity between an object and a device. As another example, embodiments of the present invention may determine whether a device and an object are in proximity to each other by identifying the location of the object and/or the location of the device, and by determining whether (or that) the object and the device are in proximity to each other based on their locations (such as by determining whether the locations of the object and the device differ from each other by no greater than some predetermined maximum threshold distance, e.g., 0.1 meter). Global positioning system (GPS) technology or other similar positioning or locating technology may, for example, be used to identify the locations of the device and the object (although in other cases the location of an object, such as a retail store, may be fixed and known, e.g., predetermined and stored in a database). Auditory and/or vibration sensors may be used to determine the identity, location, and/or activity performed by the user 199, device 128, and/or object 106, and thereby determine whether the device 128 is in proximity to the object 106. In general, when embodiments of the present invention determine that an object and a device (or a user associated with the device) are approximately, significantly, or precisely in the same place at approximately, significantly, or precisely the same time, such embodiments may conclude that the object and the device are in proximity to each other. Notably, such a determination and/or conclusion may, for example, be made by the device, a remote server (processor), the object, another element of the present invention, or any combination of these. As one example of this, the locations of the object and the device may be identified by locating means that are separate and distinct from the object and the device. Other means of determination of proximity are possible and fall within the scope of the present invention, including but not limited to the use of optical detection technologies, sound detection technologies, electromagnetic signal detection technologies, and location identification detection means (associated with a device or otherwise). In particular, embodiments of the present invention may include optical imaging or scanning technology (including but not limited to the use of image recognition and similar technologies that may be used to determine that an object and a device, or an object and a user, are in proximity) and auditory and/or vibration sensing technology (including but not limited to the use of sound detection and/or processing to determine whether the user 199 and/or device 128 are in proximity to the object 106). Without limitation, any technology or means that enables a determination that a particular object and a particular device (or a user associated with a particular device) are in proximity to one another may be used as proximity determination means in various embodiments of the present invention. An object and a device may be approximated (e.g., brought closer to one another, also considered the action of approximation) to cause them to be in proximity, by moving the device or the object, or both.

Proximity determination may also involve the use of a dedicated tag. Embodiments of a dedicated tag may be a NFC-type or RFID-type local transmitter, capable of transmitting a signal within a generally predefined range (depending on a variety of factors the range may vary in various directions from the dedicated tag). Such embodiments of a dedicated tag may be placed or positioned on, at or near an object, for example, such as on a store shelf or attached to a floor, ceiling wall or outdoor surface, or embedded within a product or product packaging, for example. In such embodiments, the dedicated tag transmits a signal that causes a device to communicate information relating to a user of the device (e.g., an identifier of the user 199) to a remote server or the dedicated tag, or some other element of a system of the present invention. An embodiment of a dedicated tag of the present invention includes a dedicated tag identity and a dedicated tag identifier, which may be different from an object identity and object identifier (for an object with which the dedicated tag is associated, perhaps in some cases transiently or temporarily). Physiologic data may be sensed before, after, or exclusively during a device's (and presumably the device user's) proximity with the dedicated tag, meaning within a physical distance wherein the device is receiving a wireless signal from the dedicated tag, or within some predetermined maximum amount of time (e.g., one minute from the time when the device last received a signal from the dedicated tag), or within some predetermined maximum distance (e.g., within so many meters of 2-dimensional or 3-dimensional movement from a point in space where the device last received a signal from the dedicated tag), or until some trigger event occurs, such as a certain physiologic data output threshold (e.g., a user's heart rate goes below some predetermined maximum level). Such embodiments of dedicated tags may have identities as represented by their own dedicated tag identifier numbers (which may be distinct from the identities and identifier numbers of associated objects), and dedicated tags may be readily associated with objects. For example, a storeowner may have three dedicated tags and place each of the three tags in three different sections of a store: the clothing section, the home goods section, and the sporting goods section. In this example, when an embodiment of the present invention determines that a device is in proximity to of one of these three tags (and signal strength may be taken into consideration by a device or other proximity determination means to assist in the determination of proximity, or the determination of other data associated with signal strength, proximity or physical closeness or use of an object, for example) and its associated object (e.g., the section of the store), then following such a determination of proximity the device may sense and communicate the physiologic data of a user of the device. This data may be stored for later communication, wirelessly communicated to a remote processor, and/or wirelessly communicated to a dedicated tag or another element of a system of the present invention. In the case that the physiologic data is communicated to a remote processor (along with a device identifier and a dedicated tag identifier, for example), the remote processor may access a database in order to identify an object (e.g., store section, thing, place, experience, person) associated with the particular dedicated tag identifier, and to subsequently correlate the physiologic data with a particular object (store section) that has been associated with the dedicated tag identifier. In such a case, a person or other means would have provided the remote server or database with information about the object (or object identifier) that is associated with the particular dedicated tag (or dedicated tag identifier). In embodiments of the present invention, this may be done for example by means of a secure web site or page than enables a person to register (e.g., enter information about) or select a dedicated tag (possibly by using its dedicated tag identifier), and to then associate the dedicated tag with an object (or multiple objects), and to possibly subsequently modify (change) the object associated with the dedicated tag so that such a dedicated tag of the present invention may be repurposed and used again in association with a different object, for example. In such an embodiment of the present invention, it may be possible to associate a dedicated tag with more than one object, possibly even by providing information (e.g., via a secure web site or page) relating to a particular dedicated tag being associated with a first object while at a first place or during a first time (period), and then being associated with a second object while at a second place or during a second time (period), for example. Or a dedicated tag may be associated with two or more objects simultaneously. An identifier communicated by a tag or an object to a device by means of a wireless signal, for example (such identifier being associable with the identity of the object), may be transformed or translated into another representation or number or signal (e.g., a secondary or alternative identifier), at a device, for example, which may then be communicated to a remote server. Many variations relating to dedicated tags of the present invention, including their technology, form and use, fall within the scope of the present invention.

For clarity, use of the terms near-field communication (NFC), radiofrequency identification (RFID), and other similar concepts and technologies is intended to include any of a wide range of concepts and technologies that enable wireless (e.g., contactless radio) communication between a transmitter and a receiver, such as a tag that transmits a radio signal (whether the signal is actively generated, or passively generated) and a device-associated receiver that receives the signal. Strictly speaking, and relating to embodiments of the present invention, at least some current NFC systems communicate at a frequency of 13.56 MHz and use antennas that are only a few centimeters long, thereby enabling a "near field" with the field very approximately having dimensions that are similar to those of the antenna. This enables communication between the transmitting antenna (e.g., the one with an electromagnetic field pulsing at 13.56 MHz), such as an antenna that is part of a tag that is associated with an object, and a receiving (e.g., passive) antenna, such as an antenna that is associated with a device (notably, an object and a device may both be endpoints, meaning that both may receive and transmit signals in embodiments of the present invention). NFC builds on RFID technology, to the extent that (per some definitions) RFID is primarily intended as a one-way means of communication, e.g., wherein a RFID tag (which may be passive or active) sends a radio signal to a RFID receiver in order to transfer information about the identity of the tag (and thereby facilitate an understanding about the identity of an object with which the tag is associated, e.g., attached to). Embodiments of the present invention may use any NFC, RFID or other similar wireless communication concept or technology, all of which are envisioned as useful to embodiments of the present invention.

The concept of "proximity" may be defined and determined in different ways. For example, one embodiment of the present invention may determine that an object and a device are in proximity to each other in response to determining that the object and device are within a particular linear distance e.g., 1.0 centimeter of one another, where the embodiment identifies the distance between the object and the device using NFC and/or RFID means. As another example, an embodiment of the present invention may determine that an object and a device are in proximity to each other in response to determining that both the object and the device are within a certain 2-dimensional area or a certain 3-dimensional space (e.g., a "geofence"), such as within a particular retail environment or commercial space as determined by GPS or NFC means. As another example, an embodiment of the present invention may determine that an object and a device are in proximity to each other in response to determining that a radio signal emanating from a tag associated with an object is received at a device. The maximum distance that is used by embodiments of the present invention as the threshold for proximity may be defined in any variety of ways, including distances ranging from 0 centimeters (e.g., an object and a device are physically touching) to distances of meters and more, depending on the intended use of such an embodiment and desired precision of correlation between an object and a device (and/or a user of the device), for example. Other ways of defining proximity and distances between objects may be used, as well. One reason for the wide range is because correlation between the proximity of an object and a device (or a user of the device) and use of an object by a user will vary widely depending on the particular object and use case (e.g., a relevant proximity to a pencil may be different from a relevant proximity to a cargo ship in terms of utility for various embodiments of the present invention). As discussed, proximity may be determined relative to a distance (specific or approximate), presence within a particular area or space (specific or approximate), and more. In addition, any of a variety of proximity determination means, technologies and methods may be used, e.g., RFID, NFC, GPS, camera/optical, etc. Other proximity definitions and determination means and related concepts fall within the scope of the present invention.

Embodiments of the present invention may determine proximity using any of a variety of methods, and by using any of a wide range of possible means to implement such methods, for example. Some of these embodiments may involve multiple (a combination of) methods and technological means. For example, one embodiment of the present invention may use GPS to first identify an approximate location of a device (or that a device is within a certain geographic or spatial boundary or "fence"), and then use a second means, such as NFC, to determine whether the device and an object are in proximity to each other. Such a method may be useful to preserving device battery life during a determination of proximity, for example, as one lower-power consumption means may be used at first, and then (once triggered) a second higher-power consumption means may be used. There are other combinations of means and methods that confer benefits. Such benefits include, but are not limited to: improved battery life, better accuracy, the ability to deal with various types of environments, and the ability to deal with various types of objects. Other variations of means and methods for the determination or establishment of proximity fall within the scope of the present invention.

In response to determining that the device 128 is in proximity to the object-associated element 124, the system 100*a* may conclude or assume that the device 128 is in proximity to the object 106. In other words, the system 100*a* may use the proximity of the device 128 to the object-associated element 124 as a proxy for the proximity of the device 128 to the object 106.

Furthermore, in response to determining that the device 128 is in proximity to the object-associated element 124, the system 100*a* may conclude or assume that the user 199 is in proximity to the object 106. In other words, the system 100*a* may use the proximity of the device 128 to the object-associated element 124 as a proxy for the proximity of the user 199 to the object 106. Similarly, the system 100*a* may determine or assume, in response to determining that the device 128 is in proximity to the object-associated element 124, that the user 199 is using the object 106 in any of the ways disclosed herein.

The object-associated element 124 may communicate with the object 106 and/or the device in any of a variety of ways, such as any one or more of the following in any combination: direct wired connection (e.g., a bus or cable), wired and/or wireless Internet connection, wireless direct communication (e.g., Bluetooth, RFID, NFC), visual code (e.g., bar code, QR code), or auditory signal.

The object-associated element 124 may transmit an object-identifying information signal 126 to the device 128, which may receive the signal 126 using a first wireless communication module 130. The signal 126 may, for example, identify the object 106 using any one or more of the following: unique object ID, object type (e.g., refrigerator, computer, automobile), manufacturer, or model number. The object-identifying information signal 126 may include information about proximity between the object 106 (or the object-associated element 124) and the device 128. The object-associated element 124 may, for example, transmit the object-identifying information signal 126 in response to a detection that the object 106 (or the object-associated element 124) is in proximity to the device 128. The signal 126 may include additional information, such as any one or more of the following in any combination: a time (e.g., a current time or an amount of time since the object or the object-associated element 124 has been turned on), a location (e.g., a location of the object 106 and/or the object-associated element 124), a state of the object 106, and a temperature.

The object-associated element 124 may be associated with additional objects (not shown) in any of the ways disclosed herein in connection with the object 106. The object-associated element 124 may, therefore, be associated with a plurality of objects. The system 100a may include a plurality of object-associated elements of any of the kinds disclosed herein. The object-associated element 124 is optional. Embodiments of the present invention may, for example, omit the object-associated element 124 and perform various functions disclosed herein, such as determining whether the device 128 (and, by proxy, the user 199) is in proximity to the object 106, without using the object-associated element 124, such as by using the object 106 to perform the functions disclosed herein in connection with the object-associated element 124. As one particular example, embodiments of the present invention may determine that the device 128 is in proximity to the object 106 in response to determining that the object 106 and the device 128 are in the same location (or in sufficiently close locations) at the same time (or at sufficiently similar times), whether or not the object-associated element 124 is used to make that determination, and whether or not the object-associated element 124 exists within those embodiments of the present invention.

The first wireless communication module 130 may include at least one receiver, which receives the output 126 from the object-associated element 124 as input. If the object-associated element 124 transmits a plurality of outputs 126 over time, the first wireless communication module 130 may receive one or more (e.g., all) of such outputs 126 as inputs.

The device 128 includes a first wireless communication module 130. The device 128 may be any kind of computing device, such as, for example, a smartphone, tablet computer, desktop computer, or laptop computer. The first wireless communication module 130 includes at least one receiver, which wirelessly receives the output 126 from the object-associated element 124 as input. If the object-associated element 124 transmits a plurality of outputs 126 over time, the first wireless communication module 130 may receive one or more (e.g., all) of such outputs 126 as inputs.

The object-associated element 124 includes at least one transmitter, which transmits the output 126 wirelessly, and the first wireless communication module 130 receives the output 126 wirelessly. There may be no wired or mechanical coupling between the object 106 and the device 128. The object-associated element 124 may transmit the output 126, and the first wireless communication module 130 may receive the output 126, using any wireless technology and/or protocol. For example, the object-associated element 124 may transmit, and the first wireless communication module 130 may receive, the output 126 using a close-range and/or point-to-point wireless communication technology, such as a Near-Field Communication (NFC) technology.

The object-associated element 124 may transmit the output 126 over any kind of network or networks, in any combination, such as the Internet and/or a private intranet. Although the output 126 is described herein as being transmitted wirelessly, the output 126 may be transmitted entirely wirelessly or over a combination of wired and wireless connections.

The object-associated element 124 may transmit any particular power usage record as output 126 in response to any trigger, such as a manual input from a user of the object 106, or an input generated automatically by the object 106 or the object-associated element 124 (i.e., not in response to an input from a user of the object 106). In the former case, the user 199 may, for example, provide an input to the object 106 or the object-associated element 124 (such as by pressing a button on the object 106 or the object-associated element 124) to instruct the object 106 to transmit one or more power usage records, in response to which the object-associated element 124 may transmit one or more power usage records as output 126. In the latter case, the or the object-associated element 124 may generate and transmit output 126 automatically, such as automatically in response to receipt of input 114 from the power utilization sensor 154, in response to satisfaction of a time-based condition (e.g., lapse of a timer), or in response to determining that the object 106 is in proximity to the device 128, in response to which the object-associated element 124 may transmit one or more power usage records as output 126. As particular examples, the object-associated element 124 may transmit the output 126 periodically (e.g., every hour) or in response to becoming connected to a wireless network.

The device 128 may be any kind of computing device, such as, for example, a smartphone, tablet computer, desktop computer, laptop computer, or remote controller. The device 128 may, for example, be a mobile and/or wearable device. The device 128 may, for example, be a multi-use or specific-use device, such as a dedicated remote control device. Examples of the device 128 include computing devices, such as any mobile computing device having a version of the Apple iOS installed thereon (such as an Apple iPhone, Apple iPad, or Apple Watch), any mobile computing device having a version of the Google Android operating system installed thereon (such as Nexus, Android One, and Pixel smartphone), any mobile computing device having a version of the Microsoft Windows Phone operating system installed thereon (such as smartphones manufactured by HTC, LG, Samsung, Acer, Alcatel, Fujitsu, Toshiba, Nokia, and ZTE having the Microsoft Windows Phone operating system installed thereon), and any computing device having a version of the Amazon Alexa or Fire OS operating systems installed thereon (such as any version of the Amazon Kindle, Amazon Kindle Fire, Amazon Dash Button, Amazon Fire TV Stick, or Amazon Echo computing device). Another example of the device 128 includes an RFID tag (e.g., a passive or active RFID tag), which may be associated with the user 199, such that embodiments of the present invention may use the location of the RFID tag as a proxy for the location of the user 199, which may be correlated with the location of the object 106 and/or object-associated element 124 to determine whether the user 199 and/or device is in proximity to the object 106 and/or object-associated element 124.

The device 128 may include a device processor module 134. The device processor module 134 may be any kind of electronic processor, such as a central processing unit (CPU), graphics processing unit (GPU), microcontroller, or any combination thereof.

The device 128 includes device storage module 136, which may be any kind of electrical and/or magnetic memory, such as any kind of Read only Memory (ROM), volatile Random Access Memory (RAM), non-volatile Random Access Memory (NVRAM), mechanical memory (e.g., magnetic tape, hard disk drive, optical disc drive), or any combination thereof. The device storage module 136 may include any kind(s) of computer-readable storage media in any combination. For example, the device storage module 136 may include at least one persistent storage medium, such as a hard disk and/or flash memory. The device storage module 136 may include a relatively large amount of memory, such as at least 1 GB, 2 GB, 4 GB, 8 GB, 16 GB, 32 GB, or 64 GB of memory.

The device storage module 136 may store any of a variety of information, such as any one or more of the following, in any combination: an identifier of the device 128 (also referred to herein as a device ID), an identifier of the user 199 (also referred to herein as a user ID), data representing information about proximity of the device 128 to the object 106 and/or object-associated element 124, data representing information about use of power by the object 106, and data representing other information about the device 128 and/or user 199.

The device processor module 134 may receive one or more signals 132 representing some or all of the output 126 from the object-associated element 124, and store some or all of the output 126, and/or data derived therefrom, in the device storage module 136. As a particular example, after the first wireless communication module 130 receives a particular power usage record in the output 126, the first processor module 134 may store data representing some or all of that particular power usage record in the device storage module 136. This process may repeat over time, resulting in the second processor module 134 storing data representing a plurality of outputs 126, each representing a distinct power usage record, in the device storage module 136. The device 128 may calculate and store metrics based on multiple power usage records received from the object-associated element 124. For example, the device 128 may calculate and store the sum and/or average of the power amounts received from the object-associated element 124.

The device 128 also includes an input module 138, which may include any one or more input components, in any combination, such as, for example, any of the following: a keyboard, touchscreen, trackpad, mouse, network adapter, I/O port, or microphone. The input module 138 may receive any of a variety of inputs from a user (such as the user 199) and/or other devices (not shown) and provide signals representing those inputs to the device processor module 134, which may receive such signals.

The device 128 also includes an output module 140, which may include any one or more output components, in any combination, such as, for example, any of the following: a monitor, touchscreen, speaker, network adapter, I/O port, or printer. The device processor module 134 may provide any of a variety of signals to the output module 140, which may produce outputs (such as visual and/or auditory outputs) based on such signals. The device processor module 134 may, for example, read some or all of the data (e.g., power usage records) stored in the device storage module 136 and provide output representing such data to the output module 140, which may provide output based on the output received from the device processor module 134. In this way, the output module 140 may provide output (such as visual and/or auditory output) representing some or all of the power usage data stored in the device storage module 136 to a user of the device 128 and/or to other devices.

The device 128 may also include a second wireless communication module 142. The first wireless communication module 130 and the second wireless communication module 142 may overlap. For example, a single wireless communication module (not shown) may include both the first wireless communication module 130 and the second wireless communication module 142. As another example, the first wireless communication module 130 and the second wireless communication module 142 may be implemented in combination as a single wireless communication module. For ease of explanation, however, the first wireless communication module 130 and the second wireless communication module 142 will be described herein as distinct modules.

In general, the device processor module 134 provides output 144 to the second wireless communication module 142, which receives the output 144, and produces output 146 based on the output 144 received from the device processor module 134. The output 144 may, for example, include data representing some or all of the information stored in the device storage module 136. As a particular example, after the device processor module 134 stores a particular power usage record in the device storage module 136, the device processor module 134 may produce output 144 representing some or all of that particular power usage record, and the second wireless communication module 142 may produce output 146 representing some or all of that particular power usage record. The output 146 may, for example, include any one or more of the following, in any combination: data representing an amount of power received and/or consumed by the power-driven element 108, an identifier of the object 106, and a timestamp representing a time and/or time period associated with the amount of power received and/or consumed by the power-driven element 108. This process may repeat over time, resulting in the second wireless communication module 142 generating a plurality of outputs 146, each representing, for example, a distinct power usage record stored in the device storage module 136.

Terms such as "object identifier" and "identifier of the object," as used herein, refer to any data (e.g., a number and/or code) that identifies an object (e.g., the object 106). The identifier of a particular object (e.g., the object 106) may, for example, identify the object uniquely among all objects or among a particular set of objects, such as all objects having a particular make and model combination. Examples of object identifiers include data representing any one or more of the following, in any combination: a make, a model, a serial number, a date (e.g., year, month, and/or day of manufacture or sale), and a network address (e.g., IP address and/or MAC address) of an object. An object identifier may identify and be associated with one object or a plurality of objects.

Similarly, terms such as "device identifier" and "identifier of the device," as used herein, refer to any data (e.g., a number and/or code) that identifies a device (e.g., the device 128). The identifier of a particular device (e.g., the device 128) may, for example, identify the device uniquely among all devices or among a particular set of devices, such as all devices having a particular make and model combination. Examples of device identifiers include data representing any one or more of the following, in any combination: a make, a model, a serial number, a date (e.g., year, month, and/or day of manufacture or sale), and a network address (e.g., IP address and/or MAC address) of a device. A device identifier may identify and be associated with one device or a plurality of devices.

Similarly, terms such as "user identifier" and "identifier of the user," as used herein, refer to any data (e.g., a number and/or code) that identifies a user (e.g., the user 199). The identifier of a particular user (e.g., the user 199) may, for example, identify the user uniquely among all users or among a particular set of users, such as all users within a particular family, household, building, department, town, city, state, country, or organization. Examples of user identifiers include data representing any one or more of the following, in any combination: real name, email address, username, password, power utility account information, and street address of the user; information about one or more objects (e.g., object 106) which the user 199 currently is or previously has been in proximity with, used, or otherwise is or has been associated with (such object identifiers of such objects); information about one or more devices (e.g., device 128) which the user 199 currently is or previously has used, been in proximity with, or otherwise is or has been associated with (such as device identifiers of such devices); and information about a location of the user 199 (e.g., information identifying a geographic location, postal code, street address, campus, building, floor, or room in which the user 199 is located). A user identifier may identify and be associated with one user or a plurality of users.

The output 146 may include data in addition to the data received from the object-associated element 124 in the output 126. For example, the output 146 may include, for each of one or more power usage records, data representing any one or more of the following: (1) an identifier of the device 128 (which may, for example, be stored in the device 128); (2) an identifier of a user of the device 128 (e.g., user 199); and (3) data representing one or more timestamps associated with the output 126, such as one or more timestamps representing an instant in time and/or time period (e.g., a start time and an end time, or a start time and a duration) at which the output 126 was received by the device 128 and/or stored by the device 128 in the device storage module 136.

The device 128 may, for example, store such data in the device storage module 136 in combination and association with data representing each power usage record received from the object-associated element 124 in the output 126, and then retrieve such data and transmit it as part of the output 146. As another example, the device 128 may store only data representing the output 126 in the device storage module 136, and then retrieve that data from the device storage module 136 and combine it with additional data (such as data identifying the device 128 and/or a user of the device) within the output 146.

The device 128 transmits output 146 to a wireless router 148. The device 128 may transmit the output 146 by wire, wirelessly, or any combination thereof. The device 128 may produce the output 146 based on the data stored in the device storage module 136. The output 146 may, for example, include data representing some or all of the information stored in the device storage module 136. As a particular example, after the device processor module 134 stores a particular power usage record in the device storage module 136, the device processor module 134 may produce output 144 representing some or all of that particular power usage record, and the second wireless communication module 142 may produce output 146 representing some or all of that particular power usage record. The acts of generating and/or transmitting the output 146 may be triggered by any of the triggers described above in connection with the generation and/or transmission of the output 126.

The device 128 may aggregate information from multiple power usage records in the device storage module 136 into a single instance of the output 146. For example, the device 128 may aggregate information representing power usage of a particular object (e.g., object 106) over a particular period of time (e.g., 1 minute, 1 hour, 1 day, 1 week, or 1 month) into a single instance of the output 146. As another example, the device 128 may aggregate information representing power usage of a plurality of objects associated with a single utility account over a particular period of time (e.g., 1 minute, 1 hour, 1 day, 1 week, or 1 month) into a single instance of the output 146. As another example, the device 128 may aggregate information representing power usage by a particular user (e.g., user 199) over a particular period of time (e.g., 1 minute, 1 hour, 1 day, 1 week, or 1 month) into a single instance of the output 146.

The wireless router 148 may be any kind of router, and may transmit and receive any of the communications disclosed herein using any communication technology and/or protocol. The wireless router 148 may contain and/or be contained within other devices. For example, the device 128 and the wireless router 148 may be integrated into a single device which performs the functions of both the device 128 and the wireless router 148 in FIG. 1a. Although the router 148 is shown in FIG. 1a as a wireless router, the router 148 may, additionally or alternatively, be capable of transmitting and/or receiving communications by wire. For example, the output 146 may be transmitted, in whole or in part, to the router 148, by wire.

The wireless router 148 may transmit output 150, which may be received by a remote server 152. The output 150 may contain and/or be derived from some or all of the output 146. For example, the output 146 may be a message that is addressed to the remote server 152. The wireless router 148 may receive the output 146 and transmit it, and/or one or more messages derived from it, in the form of the output 150 to the remote server 152. The output 150 may, therefore, be addressed to the remote server 152. The wireless router 148 may perform such routing using any appropriate communication protocol(s), such as IP and/or any communication protocol layered on IP, such as HTTP. As is well known to those having ordinary skill in the art, a single message within the output 146 may be transmitted in one more messages within the output 150.

The system 100 also includes a remote server 152. The server 152 may be "remote" in the sense that it is connected to the wireless router 148 over a network (e.g., the Internet) and communicates with the wireless router 148 using a networking protocol (e.g., IP). The remote server 152 may be any one or more computing devices of any kind(s), such as any one or more desktop computers, laptop computers, tablet computers, and smartphones, in any combination. The remote server 152 receives the output 150 from the remote server 152.

Although only a single object 106 and device 128 are shown in FIG. 1*a* for ease of illustration and explanation, this is not a limitation of the present invention. The system 100 may include any number of objects. Each such object may have any of the properties of the object 106. Each of a plurality of objects in the system 100 may have different properties than each other. For example, the system 100 may include objects including a toaster, a refrigerator, and a lamp, each of which may be associated with (e.g., contain or be coupled to) a corresponding object-associated element. Similarly, the system 100 may include any number of devices. Each such device may have any of the properties of the device 128. Each of a plurality of devices in the system 100 may have different properties than each other. For example, the system 100 may include devices including a first smartphone, a second smartphone, a desktop computer, and a tablet computer.

A single device in the system 100 (such as the device 128) may receive output 126 from any number (e.g., 1, 2, 3, or more) of objects. Each such object may transmit its own output 126 in any of the ways disclosed herein. The device 128 may receive the output 126 from each such object, and store corresponding data in the device storage module 136, using any of the techniques disclosed herein. Because the output 126 received from each such object may include data representing a unique identifier of that object, the resulting data stored in the device storage module 136 may uniquely identify the corresponding object associated with that data.

A single object (such as the object 106) may transmit different instances of its output 126 to different devices, which may receive such output 126. For example, in response to establishing a first wireless network connection with the device 128, the object 106 may transmit first output 126 to the device 128. Then, in response to terminating the first wireless network connection with the device 128 and establishing a second wireless network connection with a second device (not shown), the object 106 may transmit second output (not shown, but having any of the properties disclosed herein in connection with output 126) to the second device in any of the ways disclosed herein.

Although only the single wireless router 148 is shown in FIG. 1*a* for ease of illustration, this is not a limitation of the present invention. The system 100 may include any number of wireless routers. Each such wireless router may have any of the properties of the wireless router 148. Each of a plurality of wireless routers in the system 100 may have different properties than each other.

A single wireless router in the system 100 (such as the wireless router 148) may receive output 146 from any number (e.g., 1, 2, 3, or more) of devices. Each such device may transmit its own output 146 in any of the ways disclosed herein. The wireless router 148 may receive the output 146 from each such device and process such output 146 in any of the ways disclosed herein in connection with the output 146.

One or more devices (e.g., the device 128) may be integrated with the wireless router 148. For example, the wireless router 148 may be contained within the device 128, in which case the output 146 may be transmitted internally within the device 128, e.g., over a wired bus within the device 128.

The device 128 may itself be an object, as that term is used herein. As a result, the device 128 may have any of the properties of the object 106 as disclosed herein. As a result, the device 128 may include some or all of the components of the object 106 and may perform some or all of the functions of the object 106. For example, the device 128 may sense and store its own power usage over time. Such a device 128 may, additionally, receive power usage data (in the form of output 126) from other objects external to the device 128.

A single device (such as the device 128) may transmit different instances of its output 146 to different wireless routers, which may receive such output 146. For example, in response to establishing a first connection with the wireless router 148, the device 128 may transmit first output 146 to the wireless router 148. Then, in response to terminating the first connection with the wireless router 148 and establishing a second connection with a second wireless router (not shown), the device 128 may transmit second output (not shown, but having any of the properties disclosed herein in connection with output 146) to the second wireless router in any of the ways disclosed herein.

The system 100*a* also includes a power utilization sensor 154. The power utilization sensor 154 may be connected to some or all of the circuits on the electric panel 104. The power utilization sensor 154 may sense the amount of electric power output by each of one or more circuits in the electric panel during one or more periods of time. The power utilization sensor 154 may transmit output 156 to a wireless router 158. The output 156 contains data representing an amount of power sensed by the power utilization sensor 154 during a particular period of time.

The power utilization sensor 154 may, for example, simultaneously sense the power output during a particular period of time by a plurality of circuits in the electric panel 104. The output 156 may include data representing distinct amounts of power output by each of the plurality of circuits, e.g., one unit of data representing an amount of power output by a first one of the plurality of circuits and another unit of data representing a distinct amount of power output by a second one of the plurality of circuits. Alternatively or additionally, the output 156 may include data representing an aggregate amount of power output by the plurality of circuits. The output 156 may include one or more timestamps representing the time period associated with the data in the output, such as a pair of timestamps representing a start time and an end time of the time period. Such timestamps may represent, for example, the time period during which the corresponding data in the output 156 was sensed by the power utilization sensor 154. The output 156 may include data identifying the circuit(s) associated with the data. For example, the output 156 may include both data representing an amount of power output by a particular circuit in the electric panel 104 and data representing an identifier of that particular circuit.

Alternatively or additionally, the output 156 may include data representing one or more objects (e.g., object 106) that consumed (or is believed that have consumed) power represented by data in the output 156. For example, consider a particular unit of data in the output 156, representing an amount of power output by a particular circuit during a particular period of time. The output 156 may also include data representing an identifier of an object (e.g., the object 106) that is determined to have consumed that amount of power. Since a particular amount of power output by a particular circuit during a particular amount of time may be consumed by a plurality of devices, the output 156 may include data representing a plurality of identifiers of a plurality of objects that are determined to have consumed the amount of power indicated in the output 156.

The power utilization sensor 154 may sense the power output by the electric panel 104 and produce the output 156 in any of a variety of ways. For example, the power utilization sensor 154 may sense the power output by the electric panel and associate portions of that power with individual objects (e.g., object 106) using any of the techniques disclosed in the following, which are hereby incorporated by reference herein: U.S. Pat. No. 9,057,746, entitled, "Determining Information About Devices in a building Using Different Sets of Features," issued on Jun. 16, 2015; U.S. Pat. No. 9,172,623, entitled, "Communication of Historical and Real-Time Information About Devices in a Building," issued on Oct. 27, 2015; and U.S. Pat. Pub. No. 2016/0148099, entitled, "Assisted Labeling of Devices with Disaggregation," published on May 26, 2016. The power utilization sensor 154 may, for example, be a Sense™ Home Energy Monitor (available from Sense Labs, Inc., of Cambridge, Mass.). These are merely examples of technologies that may be used by the power utilization sensor 154, and do not constitute limitations of the present invention. Other examples include microwave power meters; current and voltage sensors such as CurrentWatch and VoltageWatch from Eaton Corporation of Dublin, Ireland; and plug load monitors (such as the Kill a Watt plug load monitor from P3 International Corporation of New York, N.Y.).

For example, the power utilization sensor 154 may correlate a portion of the power output by a circuit in the electric panel with a power utilization signature or fingerprint that is associated with a particular object, and thereby determine that the portion of power was, or was likely to have been, consumed by the particular object. As a result, the power utilization sensor 154 may generate, in the output 156, data indicating that the particular object consumed the portion of power.

The output 156 may include one or more power usage records, as that term is used herein. Any particular power usage record within the output 156 may correspond to a particular amount of power consumed by a particular object during a particular time period and may, for example, include any one or more of the following, in any combination: (1) an identifier of the object; (2) data representing the particular time period; (3) an identifier of the circuit, within the electric panel 104, from which the object consumed power during the particular time period; and (4) the amount of power consumed by the object from the circuit during the particular time period. The output 156 may include any number of power usage records representing any combination of objects, time periods, circuits, and amounts of power.

The output 156 is received by a wireless router 158, which may have any of the characteristics of the wireless router 148 disclosed herein. In fact, the wireless routers 148 and 158 may be combined into a single wireless router which performs all of the functions disclosed herein in connection with the wireless routers 148 and 158. In general, the wireless router 158 receives the output 156 and generates and transmits output 160, representing some or all of the output 156, to the remote server 152. The wireless router 158 may generate and transmit the output 160 based on the output 156 in any of the ways disclosed herein that the wireless router 148 may use to generate and transmit the output 150 based on the output 146. The remote server 152 may receive the output 160 in any of the ways disclosed herein in which the remote server 152 may receive the output 150.

Figure 1B:
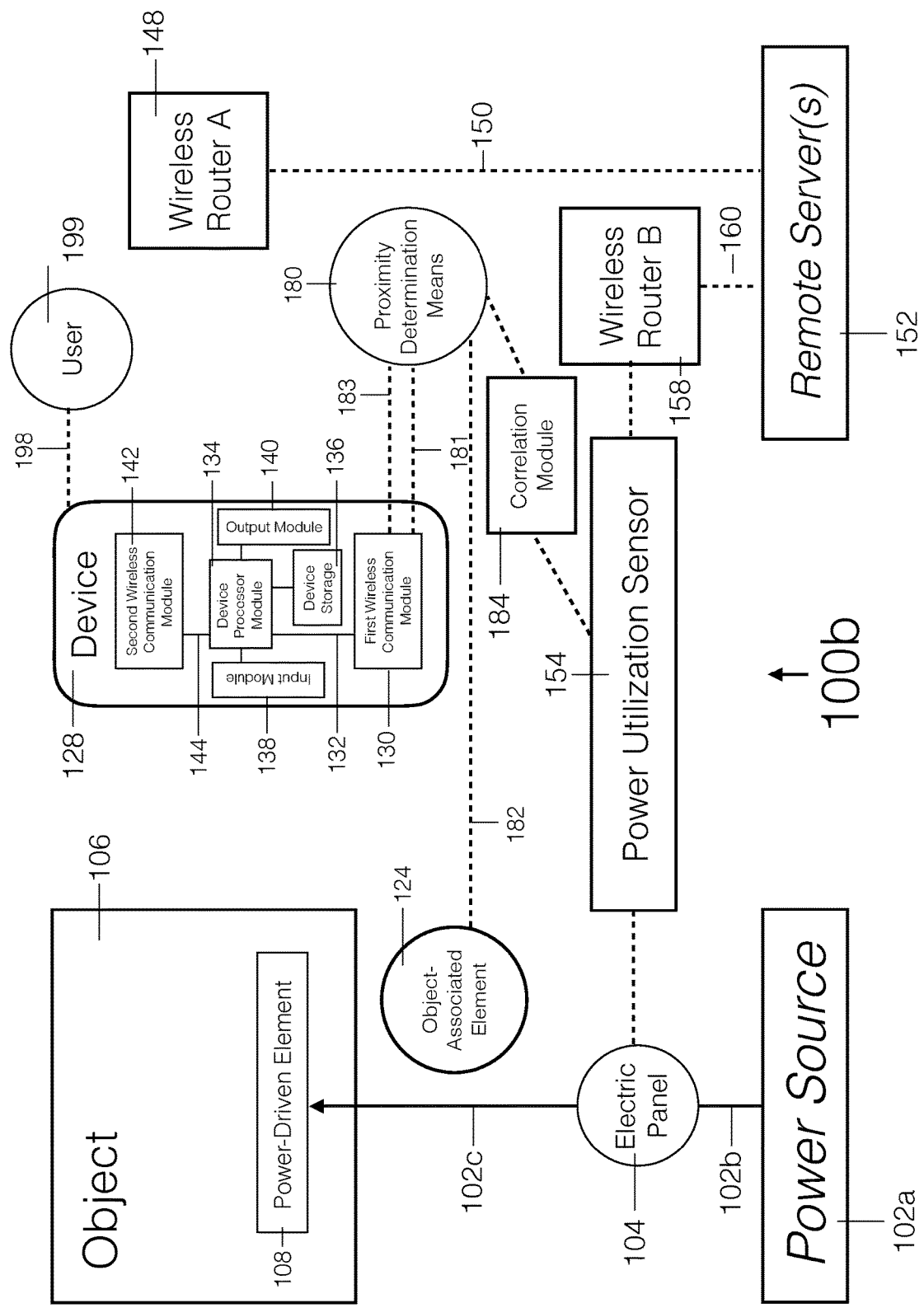

Referring to FIG. 1b, a system 100b is shown according to another embodiment of the present invention. The system 100b of FIG. 1b includes many of the same elements as the system 100a of FIG. 1a. For ease of explanation, elements in FIG. 1b that are the same as those in FIG. 1a are not described separately herein in connection with FIG. 1b. Instead, the description herein of such elements in FIG. 1a is equally applicable to those elements in FIG. 1b.

The system 100b of FIG. 1b, in contrast to the system 100a of FIG. 1a, includes a proximity determination means 180. In general, the proximity determination means 180 determines whether the object-associated element 124 is in proximity to the device 128 during a particular period of time. The proximity determination means 180 may, for example, determine whether the object-associated element 124 is in proximity to the device 128 based on one or both of: (1) proximity output 182 received and/or sensed from the object-associated element 124; and (2) proximity output 183 received and/or sensed from the device 128. If the proximity determination means 180 determines that the object-associated element 124 is in proximity to the device 128 during a particular period of time, then, in response to that determination, the proximity determination means 180 provides an object-identifying information signal 126 to the device 128. The object-identifying information signal 126 may, for example, take any of the forms, be transmitted in any of the ways, and be processed by the device 128 in any of the ways disclosed herein in connection with the object-identifying information signal 126 in FIG. 1a. If the proximity determination means 180 determines that the object-associated element 124 is not in proximity to the device 128 (or does not determine that the object-associated element 124 is not in proximity to the device 128), then the proximity determination means 180 may indicate such non-proximity to the device 128 in the signal 181.

The proximity determination means 180 may, for example, identify a current location of the object-associated element 124 and a current location of the device 128, where "current" refers to a particular time (such as the current time) or to times for the object-associated element 124 and the device 128 that are within some threshold amount of each other. The proximity determination means 180 may, for example, determine that the object-associated element 124 and the device 128 are in proximity to each other in response to determining that their locations are within some maximum threshold distance of each other at the same time (or sufficiently similar times). The proximity determination means 180 may identify the current locations of the object-associated element 124 and the device 128 in any of a variety of ways, such as based on information in the output 182 and 181 received from the object-associated element 124 and the device 128, respectively, and/or from external location sources, such as GPS data and/or location data received from one or more servers. As these examples illustrate, the output 182 and 181 may, but need not, be received from the object-associated element 124 and the device 128, respectively. For example, the output 182 may be received from a server which stores data about the location of the object-associated element, rather than from the object-associated element 124 itself.

As another example, the proximity determination means 180 may determine that the device 128 is the closest of a plurality of devices to the object-associated element 124 and, in response to such a determination, determine that the device 128 is in proximity to the object-associated element 124. As yet another example, the proximity determination means 180 may determine that the device 128 is logged in to an online account, and that the online account contains data representing the object 106 or data indicating an association between the object 106 and the device 128, and conclude, in response to this determination, that the device 128 is in proximity to the object-associated element 124.

Although the proximity determination means 180 is shown as a standalone element in FIG. 1*b*, this is merely an example and not a limitation of the present invention. Some or all of the proximity determination means 180 may be integrated with one or more other elements of the system 100*b* of FIG. 1*b*, such as the device 128, the wireless router 148, and the wireless router 158. As a particular example, the device 128 may include the proximity determination means 180.

The device 128 may be used by, and otherwise associated with, the user 199. If the system 100*b* (e.g., device 128 and/or proximity determination means 180) determines that device 128 is in proximity to the object-associated element 124, then the system 100*b* (e.g., device and/or proximity determination means 180) may conclude, based on that determination, that the user 199 of the device 128 is also in proximity to the object-associated element 124.

The proximity determination means 180 may use any of a variety of techniques to determine whether the device 128 is physically near to, and therefore in proximity to, the object-associated element 124. How physically close the device 128 and the object-associated element 124 need to be to each other in order to be considered by the system 100*b* to be "in proximity to each other" may vary according to, e.g., the powered object, the user, user behavior, and established norms. The proximity determination means 180 may, for example, conclude that the device 128 and object-associated element 124 are in proximity to each other in response to determine that they are touching each other, within a centimeter of each other, within a meter of each other, or within 10 meters of each other. For example, if the object 106 is a toaster, then the proximity determination means 180 may conclude that the device 128 is in proximity to the object 106 in response to determining that the device 128 is within a particular maximum distance (e.g., 0.5 meters) of the object-associated element 124. As another example, if the object 106 is an electric car, then the proximity determination means 180 may conclude that the device 128 is in proximity to the object 106 in response to determining that the device 128 is inside of (e.g., touching, or within less than 1 centimeter of the exterior envelope of) the electric car.

The proximity determination means 180 may be any of a variety of means that is adapted to identify, and which may identify, the distance or proximity between the device 128 and the object-associated element 124. The proximity determination means 180 may, for example, include a near-field communication module and/or a radiofrequency identification (RFID) receiver to identify the distance between the device 128 and the object-associated element 124. As another example, the proximity determination means 180 may include and use an optical module to identify the distance between the device 128 and the object-associated element 124. Such an optical module may, for example, use an image recognition algorithm or an optical code (e.g., a QR code) to identify the object-associated element 124 and/or the distance from the object-associated element 124 to the device 128. As another example, the proximity determination means 180 include an use a position location module (e.g., a global positioning system (GPS) module) to identify the location of the device 128 and/or object-associated element 124, and to identify the distance therebetween. The proximity determination means 180 may, for example, use such a position location module to identify a location of the device 128 at a particular time (e.g., the current time), and identify a location of the object-associated element 124 at or around that particular time (whether using the position location module or otherwise, e.g., by obtaining the location of the object-associated element from a database or other source), and then identify a distance between the identified locations of the device 128 and the object-associated element 124. The proximity determination means 180 may then determine whether the identified distance satisfies a proximity criterion (e.g., is less than a predetermined maximum distance). If the proximity determination means 180 determines that the identified distance does satisfy the proximity criterion, then the proximity determination means 180 may determine that the device 128 and the object-associated element 124 (and, therefore, the object 106) are or were in proximity to each other at or around the particular time; otherwise, the proximity determination means 180 may conclude that the device 128 and the object-associated element 124 (and, therefore, the object 106) are not or were not in proximity to each other at or around the particular time.

Regardless of how the proximity determination means 180 determines whether the device 128 and object-associated element 124 are in proximity to each other, if the proximity determination means 180 determines that the device 128 and object-associated element 124 are in proximity to each other, then the proximity determination means 180 may conclude, in response to this determination, that the user 199 of the device 128 is in proximity to the object-associated element 124 and/or the object 106. Conversely, if the proximity determination means 180 determines that the device 128 and object-associated element 124 are not in proximity to each other, then the proximity determination means 180 may conclude, in response to this determination, that the user 199 of the device 128 is not in proximity to the object-associated element 124 and/or the object 106.

The proximity determination means 180 and the power utilization sensor 154 may each communicate with a correlation module 184. Data that the proximity determination means 180 may provide (e.g., transmit over a network) to the correlation module 184 include, for example, any one or more of the following, in any combination:

a location of the device 128;
an identifier of the device 128 and/or user 199;
a location of the object-associated element 124 and/or object 106;
an identifier of the object-associated element 124 and/or object 106;
a distance between the device 128 and the object-associated element 124 and/or object 106;
an indicator (e.g., a binary indicator) indicating whether or not the device 128 is in proximity to the object-associated element 124 and/or object 106; and
timestamps or other time data associated with any one or more of the data elements above.

Data that the power utilization sensor 154 may provide (e.g., transmit over a network) to the correlation module 184 include, for example, any one or more of the following, in any combination:

an identifier of the object-associated element 124 and/or object 106;
one or more power usage records associated with the object-associated element 124 and/or object 106;
a location of the object-associated element 124 and/or object 106; and timestamps or other time data associated with any one or more of the data elements above.

The correlation module 184 may receive such data from the proximity determination means 180 and the power utilization sensor 154 and correlate such data with each other to identify data from the power utilization sensor 154 that relates to the same object, object-associated element, device 128, or user 199 as data from the proximity determination means 180. The correlation module 184 may then combine or create and store an association between any data determined to be correlated with each other. For example, the correlation module 184 may determine that any data received from the proximity determination means 180 which includes a particular object identifier correlates with data including the same object identifier received from the power utilization sensor 154.

The correlation module 184 may take any of a variety of forms. For example, as shown in FIG. 1b, it may be a standalone module. It may, however, be incorporated, in whole or in part, into one or more of the elements of FIG. 1b, such as any one or more of the following: the power utilization sensor 154, the proximity determination means 180, the object 106, the device 128, and the remote server 152. The correlation module 184 may output (e.g., transmit over a network) any of the data described herein to any of the other elements of the system 100b, such as any one or more of the power utilization sensor 154, the proximity determination means 180, the object 106, the device 128, and the remote server 152.

Figure 1C:
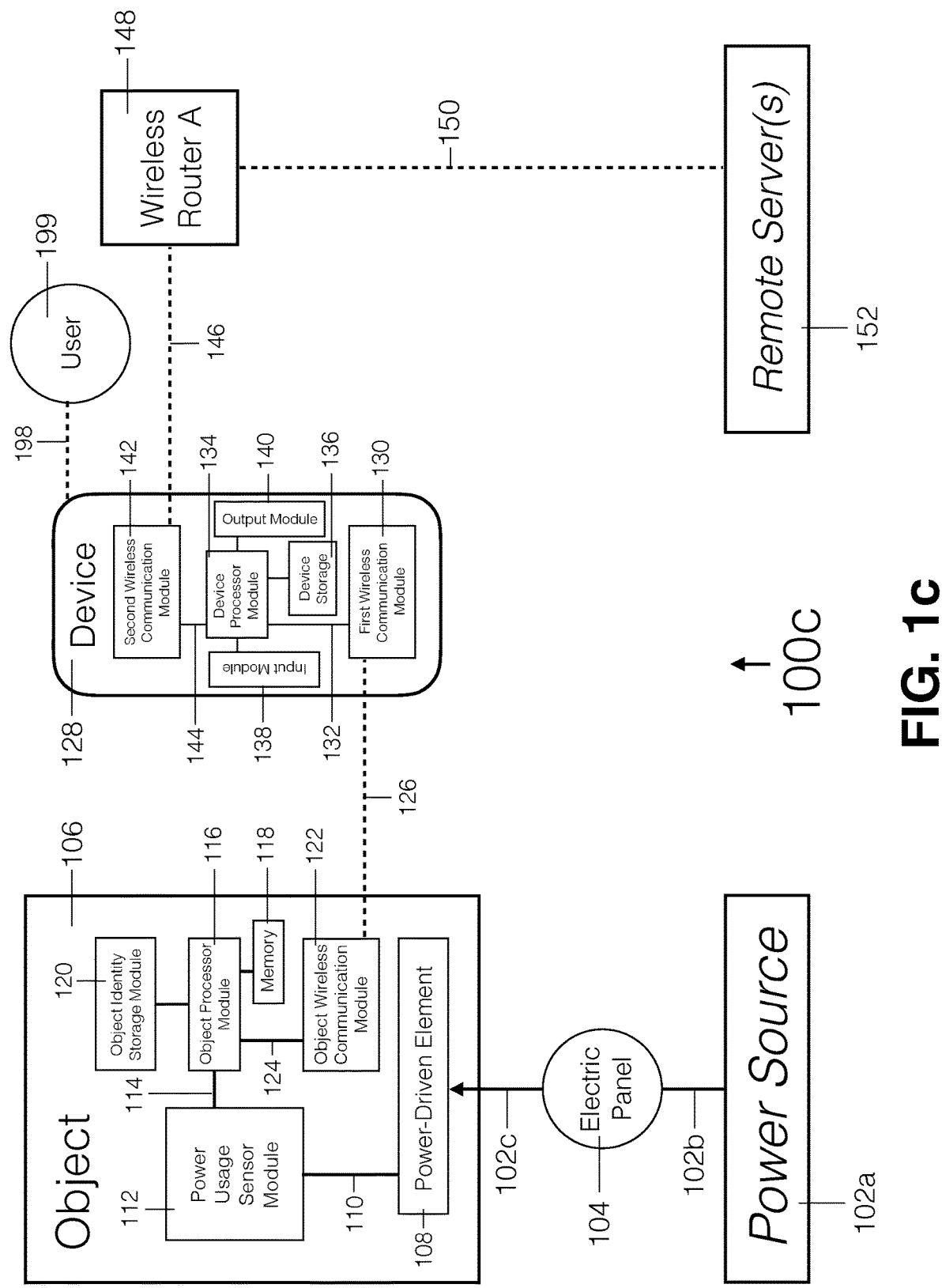

Referring to FIG. 1c, a system 100c is shown according to one embodiment of the present invention. The system 100c of FIG. 1c is similar to the system 100b of FIG. 1b. As a result, identical or similar elements in both systems are not described here separately in connection with the system 100c of FIG. 1C. Elements of the system 100c of FIG. 1c which differ from elements of the system 100b of FIG. 1C include the following:

Object 106 includes a power usage sensor module 112, which may perform the same or similar functions as the power utilization sensor 154, except that the power usage sensor module 112 of FIG. 1c may only perform its functions in connection with power usage of the object 106. Other objects in the system 100c (not shown) may include their own power usage sensor modules, which may perform the same function as power usage sensor module 112 in connection with those other objects.

Power usage sensor module 112 may receive sensed power input 112 from the power-driven element 108, representing an amount of power delivered to an/or consumed by power-driven element 108 at a particular point in time and/or during a particular period of time, in any of a variety of ways, such as any of the ways disclosed herein in connection with the power utilization sensor 154.

Power usage sensor module 112 may provide output 114, based on the sensed power input 112, to the object processor module 116, where the output 114 represents an amount of power delivered to and/or consumed by the power-driven element 108 at a particular point in time and/or during a particular time period. Such data 114 may include any of the kinds of data disclosed herein in connection with the power utilization sensor 154.

The power usage sensor module 112 may be coupled to the power-driven element 108, and receive the input 110 via such a coupling, in any of a variety of ways. For example, the power usage sensor module 112 may be coupled to the power-driven element 108 by one or more wires, which may receive the input 110 in the form of one or more analog and/or digital signals.

If the power-driven element 108 is one of a plurality of power-driven elements in the object 106, then the power usage sensor module 112 may sense power from one, two, or more of such power-driven elements, using any of the techniques disclosed herein. In certain embodiments, the object 106 contains exactly one power usage sensor module for each power-driven element in the object 106, and each such power usage sensor module senses power only for its corresponding power-driven element.

The power usage sensor module 112 may be coupled to the object processor module 116, and provide the output 114 to the object processor module 116, in any of a variety of ways. For example, the power usage sensor module 112 may be coupled to the object processor module 116 by one or more wires (e.g., a bus), or wirelessly, and the power usage sensor module 112 may provide the output 114 to the object processor module 116 over such wires in the form of one or more analog and/or digital signals.

The power usage sensor module 112 may generate the output 114 based on the input 110 in any of a variety of ways. For example, if the input 110 includes one or more analog signals, the power usage sensor module 112 may calculate an amount of power usage within a particular instant or period of time represented by such one or more analog signals, and generate the output 114 as one or more digital signals representing the calculated amount of power usage.

The object 106 may also include an object processor module 116, which may have any of the characteristics described above in connection with the device processor module 134. The device processor module 134 and the object processor module 116 may have different characteristics than each other. For example, in certain embodiments the object processor module 116 includes a relatively simple processor and the device processor module 134 includes a significantly more sophisticated processor. The device 128 may, for example, be or include a desktop computer, a laptop computer, a tablet computer, a smartphone, or a wearable computer (e.g., smart watch), in which case the device processor module 134 may include a processor suitable to such a computing device.

The object 106 also includes a memory 118, which may be any kind of electrical and/or magnetic memory, such as any kind of Read only Memory (ROM), volatile Random Access Memory (RAM), non-volatile Random Access Memory (NVRAM), mechanical memory (e.g., magnetic tape, hard disk drive, optical disc drive), or any combination thereof.

The memory 118 may, for example, consist of a relatively small amount of memory, such as no more than 1K, 2K, 4K, 16K, 128K, 1 MB, 2 MB, 4 MB, or 16 MB of memory. The object processor module 116 may be coupled to the memory 118 in any of a variety of ways that are well-known to those having ordinary skill in the art, and may write data and/or instructions to, and read data and/or instructions from, the memory 118 in any of a variety of ways.

Regardless of the form taken by the output 114 and the method used by the power usage sensor module 112 to produce the output 114, the object processor module 116 may receive the output 114 and store, in the memory 118, any one or more of the following, in any combination:

One or more power usage records containing data representing power used by the power-driven element 108, such as data representing the amount of power usage represented by the output 114. The object processor module 116 may generate such data based on the sensed power input 110.

Data representing a unique identifier of the object 106. The object processor module 116 may, for example, receive data representing an identity of the object 106 from an object identity storage module 120 in the object 106, and store such data (and/or data derived therefrom) in the memory 118. (The object identity storage module 120 may, for example, be integrated with the memory 118.) The data stored in the object identity storage module 120, representing the identity of the object 106, may represent any of a variety of information, such as any one or more of the following, in any combination:

a manufacturer, model, or serial number of the object 106;
a type of the object 106;
a seller (e.g., retailer) of the object 106;
a purchaser, lessee, or owner of the object 106;
an account number associated with the object 106 at the power source 102a (e.g., Entity B 174); and
data representing a contract associated with the object 106 (e.g., a contract between a purchaser/lessee/ owner of the object 106 and Entity B 174, or a contract between Entity A 164 and Entity B 174).

Data representing one or more timestamps associated with the output 114, such as one or more timestamps representing an instant in time and/or time period (e.g., a start time and an end time, or a start time and a duration) at which the sensed power input 110 was received by the power usage sensor module 112 from the power-driven element 108.

Some or all of the data above may be stored in association with each other in the memory 118. For example, some or all of the data above may be stored in a single data structure in the memory 118, such as a single row in a database table. A single such collection of data (e.g., data structure), representing a particular amount of sensed power associated with (e.g., sensed at) a power point in time or during a particular time period in association with a particular object or objects, is referred to herein as a "power usage record," regardless of the form in which that data structure is stored. For example, a single power usage record may contain data representing: (1) a particular object (e.g., the object 106); (2) a particular time period; and (3) a particular amount of power sensed to have been consumed by the particular object (e.g., by the power-driven element 108) during the particular time period.

As a result of storing a power usage record, the object processor module 116 may easily retrieve some or all of the data in a power usage record at a subsequent time. For example, if the object processor module 116 receives a query requesting some or all data associated with a particular object and a particular timestamp, the object processor module 116 may find a power usage record containing data representing the particular object and the particular timestamp in the memory 118, and then retrieve some or all of the other data (e.g., power usage amount) contained within the found power usage record.

As the power usage sensor module 112 senses additional units of power over time (e.g., as the power usage sensor module 112 receives additional inputs from the power-driven element 108 representing amounts of power used at different times and/or during different time periods), the power usage sensor module 112 may generate and provide to the object processor module 116 additional outputs 114 representing such additional units of power, in response to which the object processor module 116 may store additional corresponding power usage records in the memory 118, using the techniques described above, representing such additional units of power. As a result, over time, the memory 118 may accumulate and store a plurality of power usage records representing a plurality of amounts of power (and associated data) received and/or consumed by the power-driven element over time.

The object 106, however, need not store multiple power usage records in the memory 118. The object 106 may, for example, store at most only a single power usage record in the memory 118 at any particular time, in which case when the object processor module 116 stores a power usage record in the memory 118, such a power usage record may overwrite any power usage record previously stored in the memory 118. The memory 118 may, in fact, be capable of storing only a single unit of data or a small number of units of data at any particular point in time.

The object 106 also includes a first wireless communication module 122. In general, the object processor module 116 provides output 124 to the first wireless communication module 122, which receives the output 124, and produces (e.g., wirelessly transmits) output 126 (e.g., a wireless signal) based on the output 124 received from the object processor module 116. The output 126 may, for example, include data representing some or all of the information (e.g., power usage records) contained in the output 124 and/or stored in the memory 118. As a particular example, after the object processor module 116 stores a particular power usage record in the memory 118, the object processor module 116 may produce output 124 representing some or all of that particular power usage record, and the first wireless communication module 122 may produce output 126 representing some or all of that particular power usage record. The output 126 may, for example, include data representing an amount of power received and/or consumed by the power-driven element 108, an identifier of the object 106, and a timestamp representing a time and/or time period associated with the amount of power received and/or consumed by the power-driven element 108. This process may repeat over time, resulting in the first wireless communication module 122 generating a plurality of outputs 126, each representing a distinct unit of data stored in the memory 118.

Referring to FIG. 2, a dataflow diagram is shown of a system 200a for communicating power usage and other data among a remote server 152, an entity 174, an entity 164, and a power source 102a.

The system 200a includes an Entity 164 (also referred to herein as "Entity A") and a server 162 (also referred to herein as "Server A"). Server A 162 may, for example, be associated with (e.g., owned, operated, and/or otherwise controlled by) Entity A 164. Server A 162 may, for example, be physically located in a property (e.g., building) owned, operated, and/or otherwise controlled by Entity A 164. The Entity A 164 may, for example, be a manufacturer, retailer, or lessor of the object 106.

Entity A 164 may, for example, be associated with (e.g., own, operate, and/or otherwise control) the Power Source 102a. Entity A 164 may, for example, be an electric utility company under a legal obligation (e.g., contract) to provide electric power to an owner, operator, or lessee of object 106. Entity A 164 may, for example, provide power 102b to the electric panel 104 and/or object 106 via power source 102a. Entity A 164 (e.g., Server A 162 may communicate with the Power Source 102a), such as by receiving power usage data from the power source 102*a* and providing information to the power source 102*a* about objects connected to the power source 102*a* (e.g., object 106).

The system 200*a* also includes an Entity 174 (also referred to herein as "Entity B") and a server 172 (also referred to herein as "Server B"). Server B 172 may, for example, be associated with (e.g., owned, operated, and/or otherwise controlled by) Entity B 174. Server B 172 may, for example, be physically located in a property (e.g., building) owned, operated, and/or otherwise controlled by Entity B 174.

The remote server 152 provides data 170 to the server B 172. The data 170 may include and/or be derived from some or all of the data 150 and 160 received from the wireless routers 148 and 158, respectively. The remote server 152 may provide the data 170 to the server B 172 over any kind of network connection (e.g., wired and/or wireless) using any kind of network protocol, in any combination. The remote server 152 and server B 172 may be implemented as a single server or collection of servers.

In general, the term "server" (such as in connection with the remote server 152, server A 162, and server B 172) refers herein to any one or more computing devices of any kind(s) in any combination, such as any one or more desktop computers, laptop computers, tablet computers, and smartphones. A "server," as that term is used herein, may, but need not, communicate via a client-server protocol.

Server B 172 provides first transaction data to server A 162. The first transaction data may include and/or be derived from some or all of the data 170. Server B 172 may provide the first transaction data to the server A 162 over any kind of network connection (e.g., wired and/or wireless) using any kind of network protocol, in any combination. Server A 162 and Server B 172 may be physically distinct servers and may, for example, be located in physically distinct locations (e.g., different buildings).

The first transaction data may include data in addition to the data 170. For example, the first transaction data may include any one or more of the following, in any combination:

Data representing a contract and/or other legal relationship between Entity A 164 and Entity B 174, such as a contract obligating Entity B 174 to reimburse Entity A 164 for providing power 102*c* to the object 106.

Data representing one or more costs and/or prices of the amount of power represented by the data 170.

Server B 172 may send second transaction data (not shown) to Server A 162. Such second transaction data may have any of the properties disclosed herein in connection with the first transaction data. The second transaction data may, for example, represent power usage data and other transaction data for a customer of Entity A 164 other than the customer who owns, operates, or leases object 106.

Server B 172 may send third transaction data (not shown) to a server other than Server A 162, which is owned, operated, and/or leased by an entity other than Entity A 164 (not shown). Such third transaction data may have any of the properties disclosed herein in connection with the first transaction data. The third transaction data may, for example, represent power usage data and other transaction data for power provided by the entity other than Entity A 164. Server B 172 may transmit the second transaction data and/or the third transaction data.

In certain embodiments, the present invention may also include the ability to interact with financial billing or other systems to facilitate the billing of a specific entity (e.g., individual or organization) for that specific entity's power use (costs), for example. This could be effective, for example, in situations in which several people are living in a single dwelling and each of them desires to pay for his or her own electricity use. Another example of a situation where individual attribution of power use may be valuable is in a public space or shared office setting. In yet another embodiment of the present invention, information provided by a correlation module 184 may be used to 'debit' energy credits that have been pre-purchased by an individual. For example, a person may buy $50 worth of electricity for their personal use. As that individual uses specific powered devices, a system of the present invention determines that they are using up their allocation ($50 worth of electricity) and debits their account accordingly. A system of individually pre-purchased energy credits could enable greater responsibility for energy use, and greater energy savings at reduced environmental cost, for example. As yet another example of an embodiment of a system of the present invention, a correlation module may share information that enables powered object (such as those shared in the list above, and others) to be purchased with a pre-allocated amount of electricity and/or a certain amount of use (e.g., hours of time that the powered device may be used). For example, one may purchase a coffee maker that 'comes with' (i.e., is included in the purchase price of) the electricity required to make the first 1,000 cups of coffee. As another example, an electric heater may be sold and purchased with the first winter's electricity included. Such systems may rely on methods that include communicating power utilization information with a computer (e.g., server associated with a database) so that an account (associated with a particular individual, company or product) may be debited the amount of power used and/or the economic value (e.g., dollars) of the power used. Such debit information, and a balance of power inventory or economic value, may be shared with a user, possibly by means of a wireless device associated with the user. Such information may also be shared with a company or manufacturer, such as for the purpose of monitoring energy or other use of their products or services.

Referring to FIG. 3*a*, a flowchart is shown of a method 300 performed by one embodiment of the present invention to determine the power use at object 106 by an entity (e.g., user 199) associated with the device 128. The method 300 may, for example, be performed by any of the systems 100*a-c* of FIGS. 1*a-*1*c*.

The method 300 identifies an amount of power used by the object 106 (FIG. 3*a*, operation 310), such as by using any of the techniques disclosed herein. The identification of the amount of power used by the object 106 may include, for example, any one or more of the following, in any combination:

identifying the object 106 (e.g., obtaining or otherwise identifying an identifier of the object 106 and/or object-associated element 124);

identifying the electric panel 104 (e.g., obtaining or otherwise identifying an identifier of the electrical panel 104 and/or any individual circuits within the electric panel 104);

identifying the power utilization sensor 154 (e.g., obtaining or otherwise identifying an identifier of the power utilization sensor 154);

identifying the power source 102*a* (e.g., obtaining or otherwise identifying an identifier of the power source 102*a*);

identifying the Entity A 164 (e.g., obtaining or otherwise identifying an identifier of the Entity A 164); and identifying a time or time period associated with the amount of power used by the object 106.

The method 300 may communicate the power usage of the object 106 (including, e.g., any of the information described above) to the remote server 152 (FIG. 3a, operation 312), such as by transmitting such information to the remote server 152 over a network (such as the Internet or other IP network). As disclosed herein, such transmission may include transmitting information from the object 106 and/or object-associated element 124 to the device 128, transmitting information from the power utilization sensor 154 to the remote server 152, and transmitting information from the device 128 to the remote server 152.

The method 300 may determine that the object 106 and/or object-associated element 124 is in proximity to the device 128, using any of the techniques disclosed herein (FIG. 3a, operation 314). The method 300 may transmit any of the proximity-related data disclosed herein to the remote server 152, such as in response to determining that the object 106 and/or object-associated element 124 is in proximity to the device 128 (FIG. 3a, operation 316).

The remote server 152 may determine, calculate, or otherwise identify an amount of power that the object 106 has consumed in association with the user 199 (FIG. 3a, operation 318). For example, the remote server 152 may identify an amount of power that the object 106 has consumed during a particular time period while the device 128 (treated as a proxy for the user 199) was in proximity to the object 106 and/or object-associated element 124. The remote server 152 may, for example, consider a plurality of time periods and, for each time period, determine whether the device 128 is or was in proximity to the object 106 and/or object-associated element 124 during that time period. For each time period for which the remote server 152 determines the device 128 to be in proximity to the object 106 and/or object-associated element 124, the remote server 152 may identify the amount of power consumed by the object 106 during that time period, and add the identified amount of power to a running total of power consumed by the object 106. The remote server 152 may identify the resulting sum as the amount of power consumed by the user 199 at the object 106 during the cumulative amount of time analyzed by the remote server 152.

As a particular example, consider the following consecutive time periods:

Period 1: T through T+5 seconds: object 106 is in proximity to device 128 and object 106 consumes 10 units of power;

Period 2: T+5 seconds through T+10 seconds: object 106 is not in proximity to device 128 and object 106 consumes 5 units of power; and Period 3: T+10 seconds through T+15 seconds: object is in proximity to device 128 and object 106 consumes 3 units of power.

In this example, the remote server 152 would identify the total amount of power consumed by the object 106 in association with the user 199 as 13 units of power, because the object 106 was in proximity to the user's device 128 during Period 1 (in which the object 106 consumed 10 units of power) and Period 3 (in which the object 106 consumed 3 units of power), but not during Period 2. The sum of the amounts of power consumed by the object 106 while the object 106 was in proximity to the user's device 128, therefore, is 13 units of power in this example. Note that the method 300 may calculate a total amount of power consumed by the object 106 by summing non-consecutive time periods (e.g., time periods 1 and 3) or, in other words, by including some time periods and excluding other time periods from the sum based on whether the object 106 was in proximity to the device 128 during each time period.

Note further that the method 300 may perform the operations described above in connection with multiple devices. For example, for each time period under consideration, the method 300 may determine, for each of a plurality of devices, whether that device is in proximity to the object 106 during that time period and whether the device is associated with the user 199 during that time period. The method 300 may add the object 106's power usage during that time period to the power usage total for the user 199 in response to determining that the object 106 was in proximity to the device 128 during that time period and in response to determining that the device 128 was associated with the user 199 during that time period, and omit the object 106's power usage during that time period from the power usage total for the user 199 otherwise.

The method 300 may determine whether the user 199 is "associated with" the device 128 during a particular time period in any of a variety of ways, such as by determining any one or more of the following during the particular time period: whether the user 199 is in proximity to the device 128, determining whether the user 199 is logged in to the device 128, determining whether the user 199 is executing a particular application on the device 128, determining whether the user 199 has an account on the device 128, and determining whether the user 199 is an owner or lessee of the device.

Figure 3B:
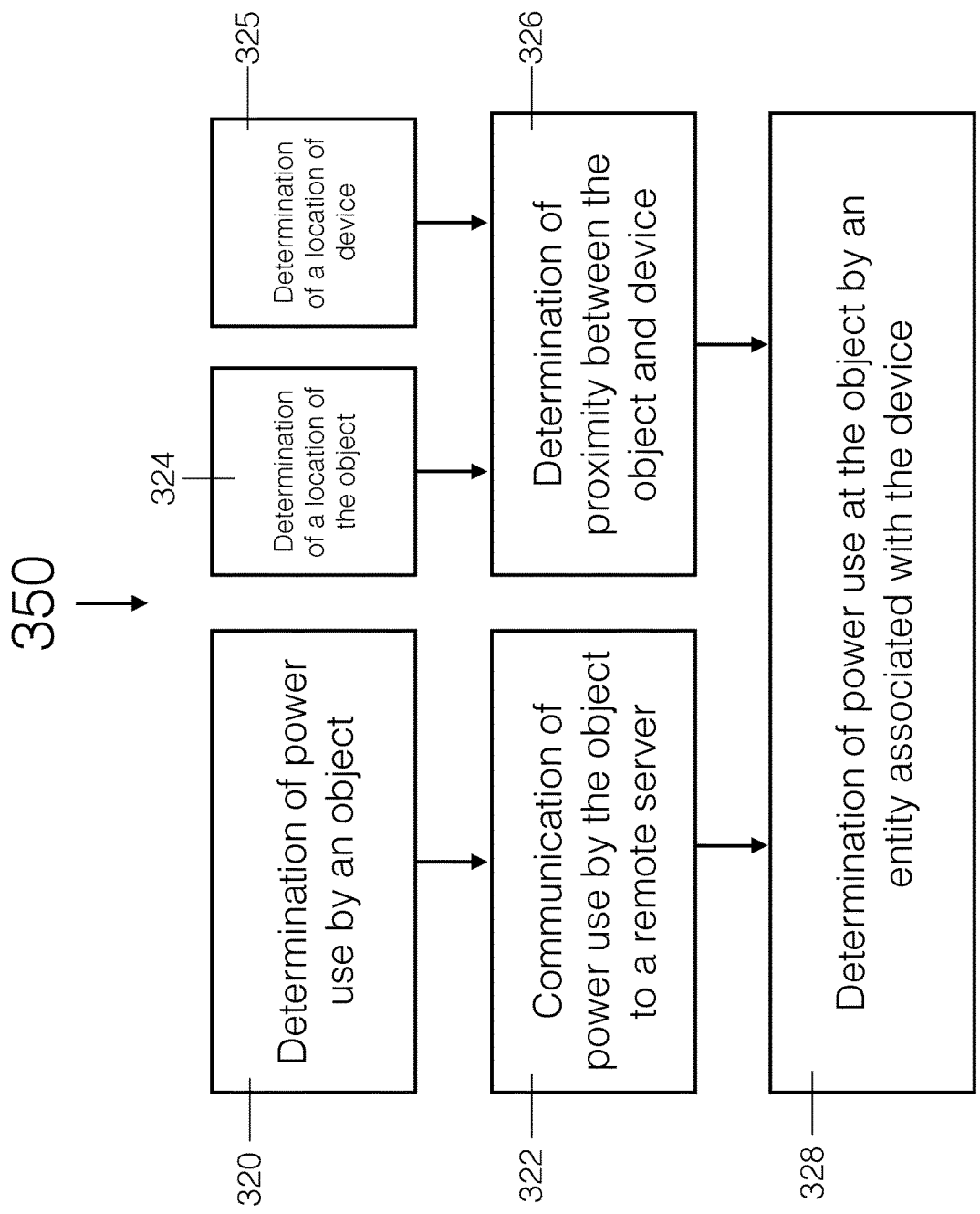

Referring to FIG. 3b, a flowchart is shown of a method 350 performed by one embodiment of the present invention to determine the power use at object 106 by an entity (e.g., user 199) associated with the device 128. The method 350 may, for example, be performed by any of the systems 100a-c of FIGS. 1a-1c.

The method 300b is similar in some ways to the method 300a of FIG. 3a. For example, operations 320 and 322 of the method 300b of FIG. 3b may be performed in the same manner as operations 310 and 312, respectively, of FIG. 3a.

The method 300 may identify a location of the object 106 (FIG. 3b, operation 324) (e.g., a location of the object 106 at a particular time or during a particular time period), such as by using any of the location-identifying techniques disclosed herein. The method 300 may identify a location of the device 128 (FIG. 3b, operation 325) (e.g., a location of the device 128 at a particular time or during a particular time period), such as by using any of the location-identifying techniques disclosed herein. The method 300 determine whether the location of the object 106 is sufficiently close to the location of the device 128, such as by determining whether the distance between the location of the object 106 and the location of the device 128 is less than some predetermined threshold. If the method 300 determines that the object 106 is sufficiently close to the device 128, then the method 300 concludes that the object 106 is in proximity to the device 128 (FIG. 3b, operation 326). The method 300 may determine an amount of power used at the object 106 by the user 199, such as by using any of the techniques disclosed above in connection with operation 318 of FIG. 3a (FIG. 3b, operation 328).

Embodiments of the present invention may calculate or otherwise identify the amount of power consumed by the object 106 during a particular period of time, such as:

the total amount of power consumed by the object 106 during the particular period of time, even if the consumed power included power obtained by the object 106 from multiple power sources (e.g., multiple electrical panels or multiple power plants);

a subset of the total amount of power consumed by the object 106 during the particular period of time, where the subset is the amount of power received by the object 106 from one or more particular power sources (e.g., electrical panels or power plants) during the particular time period;

the total amount of power consumed by the object 106 during the particular period of time, even if the consumed power included power associated with multiple users of the object; and a subset of the total amount of power consumed by the object 106 during the particular period of time, where the subset is the amount of power used by the object 106 in association with one or more particular users during the particular time period.

Embodiments of the present invention may identify an amount of power consumed by the object 106 from multiple power sources in any of a variety of ways. For example, as the object 106 consumes power, the object 106 may generate and transmit power usage records representing the object 106's consumption of power during multiple periods of time. The object 106 may receive and consume power from multiple power sources during these periods of time (e.g., power from a first power source during a first period of time and power from a second, different, power source during a second period of time). The power usage records generated and transmitted by the object 106 may or may not include identifiers of the power source from which the object 106 received power during the time periods corresponding to those power usage records. Embodiments of the present invention may identify power usage records associated with the object 106, such as by determining that power usage records which contain an identifier of the object 106 are associated with the object 106. Embodiments of the present invention may add the power usage amounts contained within those power usage records and thereby identify an aggregate amount of power consumed by the object 106 over time, even if that aggregate amount of power was received from a plurality of power sources.

Embodiments of the present invention may, however, calculate or otherwise identify an aggregate amount of power consumed by the object 106 from one or a specified set of power sources 102a during a particular period of time, which may be less than the total amount of power consumed by the object 106 during that particular period of time (e.g., if the object 106 also consumed power from additional sources during that particular period of time). For example, embodiments of the present invention may identify the power source from which the object 106 received power during any particular period of time, such as by:

identifying the electric panel 104 to which the object 106 is connected during the particular period of time, identifying a power source associated with the electric panel 104 during the particular period of time, and concluding that the object 106 is associated with the identified power source during the particular period of time;

identifying the power utilization sensor 154 to which the electric panel is connected during the particular period of time, identifying a power source associated with the power utilization sensor during the particular period of time, and concluding that the object 106 is associated with the identified power source during the particular period of time; and identifying the user 199 associated with the device 128 during the particular period of time, identifying a power source (e.g., electric utility company) associated with the user 199 during the particular period of time (such as by identifying an electric utility company with whom the user 199 has contracted to purchase electricity, whether in general or specifically for the object 106), and concluding that the object 106 is associated with the identified power source during the particular period of time.

Once the power source associated with the object 106 has been identified, embodiments of the present invention may calculate an aggregate amount of power consumed by the object 106 from that power source during a particular period of time, such as by summing power usage records associated with the particular period of time, the object 106, and the identified power source. The resulting sum may exclude power usage records associated with the particular period of time and the object 106, if those power usage records are not also associated with the identified power source.

Embodiments of the present invention may calculate or otherwise identify the aggregate amount of power consumed by the object 106 in association with a plurality of users. Embodiments of the present invention may, however, calculate or otherwise identify an aggregate amount of power consumed by the object 106 in association with only one or a finite number of users. For example, as the object 106 consumes power, the object 106 may generate and transmit power usage records representing the object 106's consumption of power during multiple periods of time. The object 106 may be associated with (e.g., in proximity to) different users during those multiple periods of time. The power usage records generated and transmitted by the object 106 may or may not include identifiers of the users who are associated with the object 106 during the time periods corresponding to those power usage records. Embodiments of the present invention may identify power usage records associated with the object 106, such as by determining that power usage records which contain an identifier of the object 106 are associated with the object 106. Embodiments of the present invention may add the power usage amounts contained within those power usage records and thereby identify an aggregate amount of power consumed by the object 106 during a particular period of time, even if that aggregate amount of power is associated with a plurality of users. Alternatively, for example, embodiments of the present invention may identify those power usage records which are associated (e.g., correlated) with only a particular user or predetermined set of users during a particular period of time, and only add the power usage amounts from the identified power usage records to the aggregate amount of power consumed by the object 106 during the particular period of time. As a result, the identified aggregate amount of power may be less than the total amount of power consumed by the object 106 during the particular period of time, because the identified aggregate amount of power only includes power consumed by the object 106 in association with the particular user or predetermined set of users (e.g., while the object 106 was in proximity to those users' devices).

Embodiments of the present invention may calculate or otherwise identify the amount of power consumed by the user 199 during a particular period of time, such as:

the total amount of power consumed by one or more objects in association with (e.g., in proximity to) the user 199 during the particular period of time, even if the consumed power included power consumed by a plurality of objects and/or obtained from a plurality of power sources (e.g., multiple electrical panels or multiple power plants); and a subset of the total amount of power consumed by one or more objects in association with (e.g., in proximity to) the user 199 during the particular period of time, where the subset is the amount of power consumed by those objects from one or more particular power sources (e.g., electrical panels or power plants) during the particular time period.

Embodiments of the present invention may consider the user 199 to be "in association with" the object 106 during a particular period of time in any of a variety of ways. For example, embodiments of the present invention may consider the user 199 to be in association with the object 106 during a particular period of time in response to determining that the user 199 (or the user's device 128) was in proximity to the object 106 (or the object-associated element 124) during the particular period of time. As another example, embodiments of the present invention may consider the user 199 to be in association with the object during a particular period of time in response to determining that the user 199 has a contractual obligation to pay for power consumed by the object 106 during the particular period of time.

Embodiments of the present invention may identify the total amount of power consumed by the object 106 in association with the user 199 during the particular period of time in any of a variety of ways. For example, as the object 106 consumes power, the object 106 may generate and transmit power usage records representing the object 106's consumption of power during multiple periods of time. The object 106 may be in association with different users during those periods of time. The power usage records generated and transmitted by the object 106 may or may not include identifiers of the users who are in association with the object 106 during the time periods corresponding to those power usage records. Embodiments of the present invention may identify the users who are in association with the object 106 during those periods of time by, for example, using the correlation module 184 in the ways disclosed above. From among all of the power usage records associated with the object 106 (e.g., containing an identifier of the object 106) during a particular period of time, embodiments of the present invention may identify a subset of those power usage records which are also associated (e.g., correlated) with the user 199, and then identify (e.g. calculate) an aggregate amount of power represented by only the identified subset of the power usage records. In this way, the total amount of power consumed by the object 106 while the object 106 was in association with (e.g., proximity to) the user 199 during the particular period of time may be identified. This may be less than the total amount of power consumed by the object 106 during the particular period of time.

As another example, embodiments of the present invention may identify the total amount of power consumed by the object 106 from a particular power source in association with the user 199 during a particular period of time in any of a variety of ways. For example, as the object 106 consumes power, the object 106 may generate and transmit power usage records representing the object 106's consumption of power during multiple periods of time. The object 106 may be in association with different users, and receive power from different power sources, during those periods of time. The power usage records generated and transmitted by the object 106 may or may not include identifiers of the users who are in association with the object 106, and identifiers of the power sources from which the object 106 received power, during the time periods corresponding to those power usage records. Embodiments of the present invention may identify the users who are in association with the object 106 during those periods of time by, for example, using the correlation module 184 in the ways disclosed above. Similarly, embodiments of the present invention may identify the power sources from which the object 106 received power during those time periods using any of the techniques disclosed herein. From among all of the power usage records associated with the object 106 (e.g., containing an identifier of the object 106) during a particular period of time, embodiments of the present invention may identify a subset of those power usage records which are also associated (e.g., correlated) with the user 199 and a particular power source (e.g., the power source 102a), and then identify (e.g. calculate) an aggregate amount of power represented by only the identified subset of the power usage records. In this way, the total amount of power consumed by the object 106 from the power source 102a while the object 106 was in association with (e.g., proximity to) the user 199 during the particular period of time may be identified. This may be less than the total amount of power consumed by the object 106 during the particular period of time.

Embodiments of the present invention may obtain, sense, measure, or otherwise identify various properties of elements of the systems 100a-c, store such properties, and transmit such properties among some or more of the elements. For example, embodiments of the present invention may obtain, sense, measure, or otherwise identify:

Power source property information, which may include information about one or more properties of the power source 102a, such an identifier (e.g., make, model, serial number, and/or unique identifier) of the power source 102a; information identifying an owner and/or operator of the power source 102a (such as an electric utility company or other entity that provides power 102b using the power source 102a); information about the type(s) of power provided or capable of being provided by the power source 102a; information about the power 102b actually provided by the power source 102a (e.g., amounts of power 102b provided by the power source 102a, optionally along with associated timestamps); information about a location of the power source 102a (e.g., information identifying a geographic location, postal code, street address, campus, building, floor, room, or object in which the power source 102a is located); information about one or more objects (e.g., the object 106) that are authorized to use power delivered by the power source 102a (e.g., identifiers of those objects); and information about one or more users (e.g., the user 199) who are authorized to use power delivered by the power source 102a (e.g., identifiers of those users, information about accounts of those users with the electric utility company or other entity that provides power 102b using the power source 102a).

Electric panel property information, which may include information about one or more properties of the electric panel 104, such as an identifier (e.g., make, model, serial number, and/or unique identifier) of the electric panel 104; information identifying an owner and/or operator of the electric panel 104 (such as a person or organization that owns, leases, or otherwise has authority to obtain power from the electric panel 104); information about the type(s) of power provided or capable of being received and/or provided by the electric panel 104; information about the power 102b actually received by the electric panel 104 (e.g., amounts of power 102*b* received by the electric panel 104, optionally along with associated timestamps); information about the power 102*c* actually provided by the electric panel 104 (e.g., amounts of power 102*c* provided by the electric panel 104, optionally along with associated timestamps); information about a location of the electric panel 104 (e.g., information identifying a geographic location, postal code, street address, campus, building, floor, room, or object in which the electric panel 104 is located); information about one or more objects (e.g., the object 106) that are connected to and/or authorized to use power delivered by the electric panel 104 (e.g., identifiers of those objects); and information about one or more users (e.g., the user 199) who are authorized to use power delivered by the electric panel 104 (e.g., identifiers of those users, information about accounts of those users with the electric utility company or other entity that provides power 102*b* to the electric panel 104).

Object information, which may include information about one or more properties of the object 106, such as an identifier (e.g., make, model, serial number, and/or unique identifier) of the object 106; information identifying an owner, lessee, and/or operator of the object 106 (such as the user 199 or other person or organization that owns, leases, or otherwise has authority to use the object 106 in a way that consumes power 102*c* from the power source 102*a*); information about the type(s) of power provided or capable of being received and/or consumed by the object 106; information about the power 102*c* actually received and/or consumed by the object 106 (e.g., amounts of power 102*c* received and/or consumed by the object 106, optionally along with associated timestamps); information about a location of the object 106 (e.g., information identifying a geographic location, postal code, street address, campus, building, floor, or room in which the object 106 is located); information about one or more users (e.g., the user 199) who currently are using or otherwise associated with the object 106 (e.g., names, usernames, account identifiers, or other identifiers of those users).

Object-associated element information, which may include information about one or more properties of the object-associated element 124, such as an identifier (e.g., make, model, serial number, and/or unique identifier) of the object-associated element 124; information about one or more properties of the object(s) (e.g., object 106) with which the object-associated element 124 is associated (e.g., make, model, serial number, and/or unique identifier); information identifying an owner, lessee, and/or operator of the object 106 and/or object-associated element 124 (such as the user 199 or other person or organization that owns, leases, or otherwise has authority to use the object 106 and/or object-associated element 124 in a way that consumes power 102*c* from the power source 102*a*); information about the type(s) of power provided or capable of being received and/or consumed by the object 106 associated with the object-associated element 124; information about the power 102*c* actually received and/or consumed by the object 106 associated with the object-associated element 124 (e.g., amounts of power 102*c* received and/or consumed by the object 106, optionally along with associated timestamps); information about a location of the object 106 and/or object associated element 124 (e.g., information identifying a geographic location, postal code, street address, campus, building, floor, or room in which the object 106 and/or object-associated element 124 is located); information about one or more users (e.g., the user 199) who currently are using or otherwise associated with the object 106 and/or object-associated element 124 (e.g., names, usernames, account identifiers, or other identifiers of those users).

Power utilization sensor information, which may include information about one or more properties of the power utilization sensor 154 (or the power usage sensor module 112), such as an identifier (e.g., make, model, serial number, and/or unique identifier) of the power utilization sensor 154; information about one or more properties of the electric panel(s) (e.g., electric panel 104) from which the power utilization sensor 154 senses power (e.g., make, model, serial number, and/or unique identifier); information about one or more properties of the object(s) (e.g., object 106) from which the power utilization sensor 154 senses power (e.g., make, model, serial number, and/or unique identifier); information identifying an owner, lessee, and/or operator of the power utilization sensor 154 (such as the user 199 or other person or organization that owns, leases, or otherwise has authority to use the power utilization sensor 154); information about the type(s) of power capable of being sensed by the power utilization sensor 154; information about the power actually sensed by the power utilization sensor 154 (e.g., amounts of power 102*c* received and/or consumed by the object 106, optionally along with associated timestamps); information about a location of the power utilization sensor 154 (e.g., information identifying a geographic location, postal code, street address, campus, building, floor, or room in which the power utilization sensor 154 is located).

Device information, which may include information about one or more properties of the device 128, such as an identifier (e.g., make, model, serial number, and/or unique identifier) of the device 128; information identifying an owner, lessee, and/or operator of the device 128 (such as the user 199 or other person or organization that owns, leases, or otherwise has authority to use the device 128); information about the object(s) currently and/or previously in proximity with or otherwise associated with the device 128 and/or user 199; information about a location of the device 128 (e.g., information identifying a geographic location, postal code, street address, campus, building, floor, or room in which the device 128 is located); information about one or more users (e.g., the user 199) who currently are using or otherwise associated with the device 128 (e.g., names, usernames, account identifiers, or other identifiers of those users).

User information, which may include information about one or more properties of the user 199, such as an identifier (e.g., any one or more of the real name, email address, username, password, power utility account information, and street address) of the user 199; information about one or more objects (e.g., object 106) which the user 199 currently is or previously has been in proximity with, used, or otherwise is or has been associated with; information about one or more devices (e.g., device 128) which the user 199 currently is or previously has used, been in proximity with, or otherwise is or has been associated with; information about a location of the user 199 (e.g., information identifying a geographic location, postal code, street address, campus, building, floor, or room in which the user 199 is located); and physiologic data relating to the user 199, such as physiologic data about the user that has been generated by one or more physiologic sensors, such as one or more physiologic sensors in a wearable computing device worn by the user 199 and/or a mobile computing device used by the user 199. Any of a variety of techniques may be used to identify the user 199 and/or to generate user information about the user 199 based on such physiologic data about the user.

Power source entity information, which may include information about power source entity 164, such as information identifying one or more power sources (e.g., power source 102*a*) to which the entity 164 provides power; information about which servers (e.g., server 162) the entity 164 owns, operates, leases, or otherwise uses or controls; information about relationships between the entity 164 and other entities (e.g., entity 174), such as information about contracts requiring entity 164 to pay the other entity/entities (e.g., entity 174) for power or to be paid by the other entity/entities (e.g., entity 174) for power.

Power monitoring entity information, which may include information about entity 174, such as information identifying one or more users (e.g., user 199) from which the entity 174 obtains sensed power information; information about which servers (e.g., server 172) the entity 174 owns, operates, leases, or otherwise uses or controls; information about relationships between the entity 174 and other entities (e.g., entity 164), such as information about contracts requiring entity 174 to pay the other entity/entities (e.g., entity 164) for power or to be paid by the other entity/entities (e.g., entity 164) for power.

Any of the information described above (e.g., power source property information, electric panel property information, object information, object-associated element information, power utilization sensor information, device information, user information, power source entity information, and power monitoring entity information) may be obtained (e.g., received over a network), generated, stored, and/or transmitted by any one or of the elements disclosed herein (e.g., the power source entity 164, the server 162, the power source 102*a*, the electric panel 104, the power utilization sensor 154, the object 106, the object-associated element 124, the device 128, the user 199, the remote server 152, the server 172, or the entity 174), in any combination. A particular element may, but need not, obtain, generate, store, and/or transmit information about itself. For example, the object 106 may or may not obtain an identifier of the object 106 and transmit that identifier to one or more other elements. Information about any first element disclosed herein may be obtained, generated, stored, and/or transmitted about any other element disclosed herein. For example, information about the object 106 (e.g., a unique identifier of the object 106) may be obtained, generated, stored, and/or transmitted by the object-associated element 124, whether or not the object 106 itself also does the same.

Any of the information described above may, for example, be obtained, generated, and/or stored by a first element of the systems 100*a-c* and then transmitted to a second element of the systems 100*a-c*, which may then obtain and store the information, and which may then transmit the information to a third element of the systems 100*a-c*, and so on. For example, the object-associated element 124 may obtain an identifier of the object 106 from the object 106, transmit that identifier to the device 128, which may receive the object identifier and transmit it to the wireless router 148, which may receive the object identifier and transmit it to the remote server 152, which may receive the object identifier and transmit it to the server 172. At any point such information may be modified and/or otherwise processed (e.g., aggregated with other information), in which case the modified and/or processed information may be transmitted to another element (possibly in addition to the original information).

Although certain elements of the systems 100*a-c* are shown as being connected to or otherwise in communication with each other, these particular connections are merely examples and not limitations of the present invention. Any of the elements of the systems 100*a-c* may be connected (e.g., by wired and/or wireless connection) and/or otherwise in communication with any of the other elements of the systems 100*a-c*. For example, although the object-associated element 124 is not shown in FIGS. 1*a*-1*c* as being in communication directly with the wireless router 148, this is merely an example and not a limitation of the present invention. The object-associated element 124 may, for example, transmit information to the wireless router 148, either in addition to or instead of transmitting information to the proximity determination means.

As described above, the correlation module 184 may correlate various data disclosed herein. More generally, any of the elements of the systems 100*a-c* (e.g., the power source entity 164, the server 162, the power source 102*a*, the electric panel 104, the power utilization sensor 154, the object 106, the object-associated element 124), the device 128, the user 199, the remote server 152, the server 172, or the entity 174 may perform correlation on data that they receive, generate, or otherwise access. Such correlation may include, for example, determining that two or more units of data contain or are otherwise associated with the same power source entity (e.g., power source entity 164), power source entity account (e.g., a residential or commercial power utility account), power source (e.g., power source 102*a*), electric panel (e.g., the electric panel 104), power utilization sensor (e.g., the power utilization sensor 154), object (e.g., the object 106), object-associated element (e.g., the object-associated element 124), device (e.g., the device 128), user (e.g., the user 199), remote server (e.g., the remote server 152), or power monitoring entity (e.g., entity 174). As a result of such correlation, the two or more units of data that are determined to be correlated may be combined with each other and/or associated with each other (e.g., by generating and/or storing data indicating that the two or more units of data are associated with each other), and the resulting data may be stored and/or transmitted in any of the ways disclosed herein.

As some particular examples of correlation, embodiments of the present invention may correlate:

Information relating to (e.g., identifying) the object 106 with information relating to the device 128 and/or user 199 to determine that the object 106 is associated with the device 128 and/or user 199, such as by one or more of the following:

Determining that the object 106 is in the same (or substantially the same) place as the device 128 and/or user 199 at the same (or substantially the same) time.

Determining that the object 106 and/or the object-associated element 124 contains information identifying the device 128 and/or the user 199.

Determining that the device 128 contains information identifying the object 106 and/or the object-associated element 124.

Determining that a data store other than the object 106, the object-associated element 124, and the device 128 contains data indicating an association between the object and/or the object-associated element 124 and the device 128 and/or user 199.

Information relating to (e.g., identifying) the power source 102a and information relating to (e.g., identifying) the power source entity 164 to determine that the power source 102a is associated with the power source entity 164.

Information relating to (e.g., identifying) the power source entity 164 and information relating to (e.g., identifying) the user 199 to determine that the user 199 is associated with (e.g., a customer of) the power source entity 164.

Information relating to (e.g., identifying) the power utilization sensor 154 and information relating to (e.g., identifying) the power source 102a and/or the power source entity 164 to determine that the power utilization sensor 154 is associated with the power source 102a and/or the power source entity 164.

Information relating to (e.g., identifying) the user 199 with information relating to the device 128 to determine that the user 199 is associated with the device 128, such as by determining that the user 199 is in the same (or substantially the same) location as the device 128 at the same (or substantially the same) time.

Information relating to (e.g., identifying) the entity 174 with information relating to (e.g., identifying) the user 199 to determine that the entity 174 is associated with the user 199, such as by looking up an identifier of the user 199 in a database containing a customer list of the entity 174.

Information relating to (e.g., identifying) the object 106 and information relating to (e.g., identifying) the entity 174 to determine that the object 106 is associated with the entity 174, such as by looking up an identifier (e.g., make, model, and/or serial number) of the object 106 in a database containing information about products of the entity 174.

Embodiments of the present invention may perform any one or more of the correlations disclosed above, in any combination. For example, embodiments of the present invention may use the correlation techniques disclosed above to determine that the object 106 is associated with the user 199, that the object 106 is associated with the entity 174, that the user 199 is associated with the entity 164, and that the user 199 is associated with the entity 174. Such correlations may be performed in any sequence and/or in parallel with each other by any element(s) of the systems 100a-c in any combination.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions. For example, any of the functions disclosed herein as being performed by a server (e.g., the server 152, the server 162, or the server 172) may be performed, additionally or alternatively, by any one or more of the other elements of the systems 100a-c (e.g., the object 106, object-associated element 124, power utilization sensor 154, device 128, and correlation module 184). As a particular example, some or all of the servers 152, 162, and 172 may be omitted from embodiments of the present invention, in which case the functions performed thereby may instead be performed by one or more other elements of the systems 100a-c. Multiple elements of the systems 100a-c may perform the same functions as each other, such as generating, storing, and/or transmitting the same data as each other. For example, multiple devices (e.g., device 128 and other, similar, devices, not shown) may perform various functions disclosed herein, such as obtaining, aggregating, and correlating power usage records, replicate the resulting data, and share the resulting data in a peer-to-peer manner, such as by using a mesh network or other peer-to-peer network architecture, thereby either eliminating the need for the servers 152, 162, and 172, or supplementing the functions performed by the servers 152, 162, and 172.

Any of the functions disclosed herein may be implemented using means for performing those functions. Such means include, but are not limited to, any of the components disclosed herein, such as the computer-related components described below.

The terms "energy" and "power" are used in connection with various embodiments of the present invention. Those having ordinary skill in the art will understand that the term "energy" may be used interchangeably with the term "power" because any particular amount of energy may be converted into an amount of power given an amount of time, given that power is the amount of energy consumed per unit time.

The techniques described above may be implemented, for example, in hardware, one or more computer programs tangibly stored on one or more computer-readable media, firmware, or any combination thereof. The techniques described above may be implemented in one or more computer programs executing on (or executable by) a programmable computer including any combination of any number of the following: a processor, a storage medium readable and/or writable by the processor (including, for example, volatile and non-volatile memory and/or storage elements), an input device, and an output device. Program code may be applied to input entered using the input device to perform the functions described and to generate output using the output device.

Embodiments of the present invention include features which are only possible and/or feasible to implement with the use of one or more computers, computer processors, and/or other elements of a computer system. Such features are either impossible or impractical to implement mentally and/or manually. For example, embodiments of the present invention automatically sense the amount of energy consumed by an object. Such automatic sensing cannot be performed manually or mentally by a human.

Any claims herein which affirmatively require a computer, a processor, a memory, or similar computer-related elements, are intended to require such elements, and should not be interpreted as if such elements are not present in or required by such claims. Such claims are not intended, and should not be interpreted, to cover methods and/or systems which lack the recited computer-related elements. For example, any method claim herein which recites that the claimed method is performed by a computer, a processor, a memory, and/or similar computer-related element, is intended to, and should only be interpreted to, encompass methods which are performed by the recited computer-related element(s). Such a method claim should not be interpreted, for example, to encompass a method that is performed mentally or by hand (e.g., using pencil and paper). Similarly, any product claim herein which recites that the claimed product includes a computer, a processor, a memory, and/or similar computer-related element, is intended to, and should only be interpreted to, encompass products which include the recited computer-related element(s). Such a product claim should not be interpreted, for example, to encompass a product that does not include the recited computer-related element(s).

Each computer program within the scope of the claims below may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor. Method steps of the invention may be performed by one or more computer processors executing a program tangibly embodied on a computer-readable medium to perform functions of the invention by operating on input and generating output. Suitable processors include, by way of example, both general and special purpose microprocessors. Generally, the processor receives (reads) instructions and data from a memory (such as a read-only memory and/or a random access memory) and writes (stores) instructions and data to the memory. Storage devices suitable for tangibly embodying computer program instructions and data include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits) or FPGAs (Field-Programmable Gate Arrays). A computer can generally also receive (read) programs and data from, and write (store) programs and data to, a non-transitory computer-readable storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

Any data disclosed herein may be implemented, for example, in one or more data structures tangibly stored on a non-transitory computer-readable medium. Embodiments of the invention may store such data in such data structure(s) and read such data from such data structure(s).

The invention claimed is:

1. A method performed by at least one computer processor executing computer program instructions stored on at least one non-transitory computer-readable medium, the method comprising:
   (A) at a first device associated with a first user, obtaining a first object identifier of a first object;
   (B) at a first sensor that is distinct from the first device, sensing first object sensed power input representing a first amount of power consumed by the first object at a first time;
   (C) obtaining a first user-associated identifier, the user-associated identifier comprising at least one of an identifier of a user of the first device and an identifier of the first device;
   (D) determining that at least one of the first user and the first device is associated with the first object;
   (E) determining that at least one of the first user and the first device is associated with the first amount of power at the first time;
   (F) updating an account associated with at least one of the first user and the first device to reflect the first amount of power;
   (G) at the first device associated with the first user, obtaining a second object identifier of a second object;
   (H) at a second sensor that is distinct from the first device, sensing second object sensed power input representing a second amount of power consumed by the second object at a second time;
   (I) obtaining a second user-associated identifier, the second user-associated identifier comprising at least one of the identifier of the user of the first device and the identifier of the first device;
   (J) determining that at least one of the first user and the first device is associated with the second object;
   (K) determining that at least one of the first user and the first device is associated with the second amount of power at the second time; and
   (L) updating the account associated with the at least one of the first user and the first device to reflect the second amount of power.

2. The method of claim 1, wherein the user-associated identifier comprises the identifier of the user of the first device.

3. The method of claim 1, wherein the user-associated identifier comprises the identifier of the first device.

4. The method of claim 1, wherein (D) comprises determining that the device is in proximity to the first object and concluding that the device is associated with the first object in response to determining that the device is in proximity to the first object.

5. The method of claim 1, wherein (D) comprises, at the first device, receiving the first object identifier of the first object, and determining, based on the receiving, that the device is associated with the first object.

6. The method of claim 1, wherein (D) comprises receiving manual input from the first user indicating that the device is associated with the first object.

7. The method of claim 1, wherein (E) comprises determining that at least one of the first user and the first device is associated with the first amount of power in response to determining that the first device was in proximity to the first object at the first time.

8. The method of claim 1, wherein (E) comprises determining that at least one of the first user and the first device is associated with the first amount of power at the first time in response to determining that at least one of the first user and the first device is associated with the first object.

9. The method of claim 1, wherein (F) comprises transmitting information representing the first amount of power to a remote server over a wide area network.

10. A system comprising at least one non-transitory computer-readable medium having computer program instructions stored thereon, the computer program instructions being executable by at least one processor to perform a method, the method comprising:
   (A) at a first device associated with a first user, obtaining a first object identifier of a first object;

(B) at a first sensor that is distinct from the first device, sensing first object sensed power input representing a first amount of power consumed by the first object at a first time;
(C) obtaining a first user-associated identifier, the user-associated identifier comprising at least one of an identifier of a user of the first device and an identifier of the first device;
(D) determining that at least one of the first user and the first device is associated with the first object;
(E) determining that at least one of the first user and the first device is associated with the first amount of power at the first time;
(F) updating an account associated with at least one of the first user and the first device to reflect the first amount of power;
(G) at the first device associated with the first user, obtaining a second object identifier of a second object;
(H) at a second sensor that is distinct from the first device, sensing second object sensed power input representing a second amount of power consumed by the second object at a second time;
(I) obtaining a second user-associated identifier, the second user-associated identifier comprising at least one of the identifier of the user of the first device and the identifier of the first device;
(J) determining that at least one of the first user and the first device is associated with the second object;
(K) determining that at least one of the first user and the first device is associated with the second amount of power at the second time; and
(L) updating the account associated with the at least one of the first user and the first device to reflect the second amount of power.

11. The system of claim 10, wherein the user-associated identifier comprises the identifier of the user of the first device.

12. The system of claim 10, wherein the user-associated identifier comprises the identifier of the first device.

13. The system of claim 10, wherein (D) comprises determining that the device is in proximity to the first object and concluding that the device is associated with the first object in response to determining that the device is in proximity to the first object.

14. The system of claim 10, wherein (D) comprises, at the first device, receiving the first object identifier of the first object, and determining, based on the receiving, that the device is associated with the first object.

15. The system of claim 10, wherein (D) comprises receiving manual input from the first user indicating that the device is associated with the first object.

16. The system of claim 10, wherein (E) comprises determining that at least one of the first user and the first device is associated with the first amount of power in response to determining that the first device was in proximity to the first object at the first time.

17. The system of claim 10, wherein (E) comprises determining that at least one of the first user and the first device is associated with the first amount of power at the first time in response to determining that at least one of the first user and the first device is associated with the first object.

18. The system of claim 10, wherein (F) comprises transmitting information representing the first amount of power to a remote server over a wide area network.

* * * * *